United States Patent
Park et al.

(10) Patent No.: US 11,967,759 B2
(45) Date of Patent: Apr. 23, 2024

(54) ANTENNA MODULE AND ELECTRONIC DEVICE INCLUDING THE SAME

(71) Applicant: SAMSUNG ELECTRONICS CO., LTD., Suwon-si (KR)

(72) Inventors: Soon Park, Suwon-si (KR); Yeonwoo Kim, Suwon-si (KR); Haekwon Lee, Suwon-si (KR); Woosup Lee, Suwon-si (KR); Hyoseok Na, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/990,778

(22) Filed: Nov. 21, 2022

(65) Prior Publication Data

US 2023/0083408 A1  Mar. 16, 2023

Related U.S. Application Data

(63) Continuation of application No. 16/911,856, filed on Jun. 25, 2020, now Pat. No. 11,509,046.

(30) Foreign Application Priority Data

Jul. 17, 2019  (KR) .................... 10-2019-0086184

(51) Int. Cl.
*H01Q 1/38* (2006.01)
*H01L 23/66* (2006.01)
(Continued)

(52) U.S. Cl.
CPC .............. *H01Q 1/38* (2013.01); *H01L 23/66* (2013.01); *H01Q 1/2283* (2013.01);
(Continued)

(58) Field of Classification Search
CPC ........ H01Q 1/38; H01Q 1/2283; H01Q 1/243; H01Q 21/065
See application file for complete search history.

(56) References Cited

U.S. PATENT DOCUMENTS 7,392,706 B2  7/2008  Momose et al.
8,976,067 B2  3/2015  Fischer
(Continued)

FOREIGN PATENT DOCUMENTS

CN  108702403 A  10/2018
CN  110022385 A  7/2019
(Continued)

OTHER PUBLICATIONS

U.S. Appl. No. 16/911,856, filed Jun. 25, 2020; Park et al.
(Continued)

*Primary Examiner* — Graham P Smith
(74) *Attorney, Agent, or Firm* — Nixon & Vanderhye P.C.

(57) ABSTRACT

Disclosed is an antenna module including a first printed circuit board (PCB) including a first surface facing a first direction and a second surface facing a second direction opposite the first direction, a second PCB including a third surface facing the first direction spaced from the first PCB and a fourth surface facing the second direction spaced from the first surface, a radio frequency integrated circuit (RFIC) disposed on the first surface, and a connection member comprising a conductive material connecting the first surface to the fourth surface. The at least one first conductive pattern is connected to the RFIC. The at least one third conductive pattern is connected to the RFIC via the connection member. The at least one first conductive pattern and the at least one third conductive pattern at least partially overlap with each other at least partly, when viewed from above the second surface.

18 Claims, 19 Drawing Sheets

(51) Int. Cl.
*H01Q 1/22* (2006.01)
*H01Q 1/24* (2006.01)
*H01Q 21/06* (2006.01)

(52) U.S. Cl.
CPC ........... *H01Q 1/243* (2013.01); *H01Q 21/065* (2013.01); *H01L 2223/6677* (2013.01)

(56) References Cited

U.S. PATENT DOCUMENTS

| | | | |
|---|---|---|---|
| 9,380,724 | B2 | 6/2016 | Ikuta |
| 9,699,889 | B2 | 7/2017 | Ikuta |
| 9,998,576 | B2 | 6/2018 | Kim et al. |
| 10,170,838 | B2 | 1/2019 | Garcia et al. |
| 10,431,892 | B2 | 10/2019 | Garcia et al. |
| 10,840,583 | B2 | 11/2020 | Lee et al. |
| 11,509,046 | B2 | 11/2022 | Park et al. |
| 2007/0089525 | A1 | 4/2007 | Momose et al. |
| 2009/0231225 | A1 | 9/2009 | Choudhury et al. |
| 2012/0313821 | A1 | 12/2012 | Fischer |
| 2013/0271925 | A1 | 10/2013 | Ikuta |
| 2015/0070228 | A1 | 3/2015 | Gu et al. |
| 2015/0234003 | A1 | 8/2015 | Shiozaki et al. |
| 2016/0056544 | A1 | 2/2016 | Garcia et al. |
| 2016/0172761 | A1 | 6/2016 | Garcia et al. |
| 2016/0240915 | A1 | 8/2016 | Nam et al. |
| 2017/0201011 | A1 | 7/2017 | Khripkov et al. |
| 2017/0222316 | A1 | 8/2017 | Mizunuma et al. |
| 2017/0273173 | A1 | 9/2017 | Ikuta |
| 2017/0317418 | A1 | 11/2017 | Garcia et al. |
| 2018/0026342 | A1 | 1/2018 | Chen et al. |
| 2018/0076526 | A1* | 3/2018 | Garcia ................... H01Q 19/30 |
| 2019/0020100 | A1 | 1/2019 | Jong et al. |
| 2019/0104212 | A1 | 4/2019 | Lee et al. |
| 2019/0123438 | A1 | 4/2019 | Mizunuma et al. |
| 2019/0123468 | A1 | 4/2019 | Mizunuma et al. |
| 2019/0140343 | A1* | 5/2019 | Choudhury .......... H01Q 21/065 |
| 2019/0173167 | A1 | 6/2019 | Ariumi |
| 2020/0036824 | A1 | 1/2020 | Lee et al. |

FOREIGN PATENT DOCUMENTS

| | | |
|---|---|---|
| EP | 3 846 286 A1 | 7/2021 |
| KR | 10-2019-0062064 | 6/2019 |
| WO | WO 2016/056387 A1 | 4/2016 |

OTHER PUBLICATIONS

Partial Supplemental European Search Report dated May 20, 2022 for EP Application No. 20841161.1.

Extended European Search Report dated Aug. 22, 2022 for EP Application No. 20841161.1.

International Search Report and Written Opinion dated Oct. 16, 2020 in corresponding International Application No. PCT/KR2020/008120.

Korean Office Action dated Jul. 13, 2023 for KR Application No. 10-2019-0086184.

Chinese Office Action dated Nov. 25, 2023 for CN Application No. 202080051224.9.

Korean Office Action dated Jan. 25, 2024 for KR Application No. 10-2019-0086184.

India Office Action dated Feb. 23, 2024 for IN Application No. 202117057077.

* cited by examiner

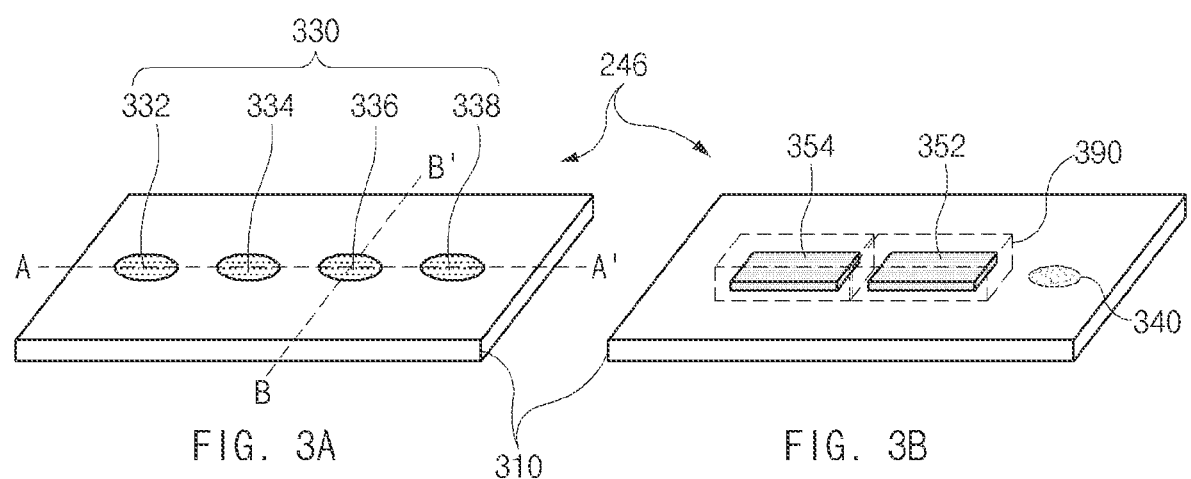
FIG. 3A
FIG. 3B
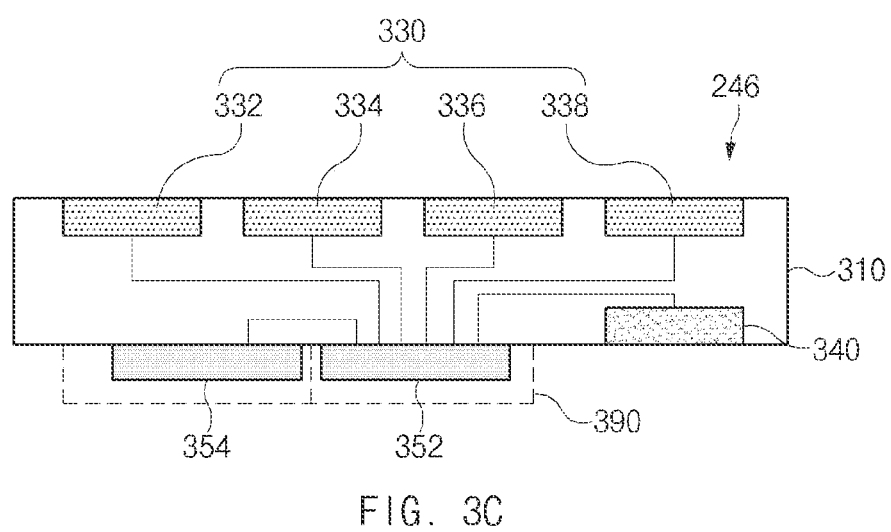
FIG. 3C

ANTENNA MODULE AND ELECTRONIC DEVICE INCLUDING THE SAME

CROSS-REFERENCE TO RELATED APPLICATION

This application is a Continuation of U.S. application Ser. No. 16/911,856, filed Jun. 25, 2020 (U.S. Pat. No. 11,509,046), which claims priority to Korean Patent Application No. 10-2019-0086184, filed on Jul. 17, 2019, the disclosures of which are all incorporated by reference herein in their entireties.

BACKGROUND

1. Field

The disclosure relates to an antenna module and an electronic device including the antenna module.

2. Description of Related Art

With the development of communication technologies, an electronic device equipped with an antenna is being widely supplied. The electronic device may transmit and/or receive a voice signal or a radio frequency (RF) signal including data (e.g., a message, a photo, a video, a music file, or a game), using the antenna. The electronic device may perform communication through a high frequency (e.g., 5G communication or millimeter wave (mmWave)).

When high-frequency communication is performed, an array antenna may be applied to overcome high transmission loss. Besides, when the high-frequency communication is performed, a beam may be formed to go straight from each antenna in one direction.

When high-frequency communication is performed, one or more patches may be disposed on an antenna module to secure beamforming performance. When the patches are positioned on the antenna module, the space and/or area for mounting the antenna module may be insufficient. To mount the antenna module on an electronic device, the patches may be disposed on one surface of the antenna module, for example, the first surface or the second surface of the antenna module.

The signal for performing high-frequency communication may have strong straightness. When the patches are positioned on one surface of the antenna module, it is not easy to form a beam in the desired direction. For example, when the patches are positioned on the first surface of the antenna module, the beam may be strongly formed in the direction of the first surface of the electronic device. However, it may not be easy to form the beam in the lateral direction of the electronic device perpendicular to the first surface.

Moreover, when the housing of the electronic device includes a conductive member such as metal, beams formed by the patches may be affected by the interference of the conductive member. For example, when the conductive member is included in at least part of the side member of the housing, it may not be easy to form a beam in the side direction of the electronic device.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and provide at least the advantages described below. Accordingly, embodiments of the disclosure provide an antenna module capable of forming a beam pattern toward the first surface, the second surface, and the side surface of an electronic device, and the electronic device including the antenna module.

In accordance with an example embodiment of the disclosure, an antenna module may include: a first printed circuit board (PCB) including a first surface facing a first direction and a second surface facing a second direction opposite the first direction, a second PCB spaced apart from the first PCB and including a third surface facing the first direction spaced from the first PCB and a fourth surface facing the second direction and spaced from the first surface, a radio-frequency integrated circuit (RFIC) disposed on the first surface, and a connection member comprising a conductive material connecting the first surface to the fourth surface. At least one first conductive pattern may be connected to the RFIC. At least one third conductive pattern may be connected to the RFIC via the connection member. The at least one first conductive pattern and the at least one third conductive pattern may at least partially overlap with each, when viewed from above the second surface. At least one first conductive pattern may be adjacent to the first surface and/or adjacent to the second surface or on the first surface and/or on the second surface. At least one third conductive pattern may be adjacent to the third surface and/or the fourth surface or on the third surface and/or the fourth surface.

In accordance with another example embodiment of the disclosure, an electronic device may include: a housing including a front plate, a rear plate facing away from the front plate, and a side surface surrounding a space between the front plate and the rear plate and connecting one side of the front plate to one side of the rear plate, a printed circuit board (PCB) disposed in the space and including at least one processor, a first PCB disposed in the space and including a first surface facing a first direction and a second surface facing a second direction opposite the first direction, a second PCB disposed in the space and including a third surface facing the first direction spaced from the first PCB and a fourth surface facing the second direction, and a connection member comprising a conductive material connecting the first PCB and the second PCB. A radio-frequency integrated circuit (RFIC) may be mounted on at least one of the printed circuit board or the first PCB. At least one first conductive pattern may be connected to the RFIC. At least one third conductive pattern may be connected to the RFIC via the connection member. At least part of the at least one first conductive pattern may overlap the at least one third conductive pattern, when viewed from above the second surface. At least part of the side surface may include a conductive material. At least one first conductive pattern may be adjacent to the first surface and/or adjacent to the second surface or on the first surface and/or on the second surface. At least one third conductive pattern may be adjacent to the third surface and/or adjacent to the fourth surface or on the third surface and/or on the fourth surface.

In accordance with another example embodiment of the disclosure, an antenna module may include: a PCB including a first surface facing a first direction and a second surface facing a second direction opposite the first direction and including a first dielectric layer having a first permittivity and interposed between the first surface and the second surface, a second dielectric layer having a second permittivity different from the first permittivity and interposed between the first dielectric layer and the second surface, a third dielectric layer having a third permittivity different from the first permittivity and the second permittivity and interposed between the second dielectric layer and the second surface, at least one first conductive pattern, at least one second conductive pattern, at least one third conductive pattern, and at least one fourth conductive pattern and an RFIC electrically connected to the at least one first conductive pattern, the at least one second conductive pattern, the at least one third conductive pattern, and the at least one fourth conductive pattern and disposed on the first surface. The at least one first conductive pattern may be disposed on the first surface or between the first dielectric layer and the first surface. The at least one second conductive pattern may be interposed between the first dielectric layer and the second dielectric layer. The at least one third conductive pattern may be disposed on the second surface or between the third dielectric layer and the second surface. The at least one fourth conductive pattern may be interposed between the second dielectric layer and the third dielectric layer.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which:

FIG. 3A is a perspective view illustrating an example antenna module when viewed from one side;

FIG. 3B is a perspective view illustrating an example antenna module when viewed from another side;

FIG. 3C is a cross-sectional view illustrating an example antenna module taken along a line A-A';

DETAILED DESCRIPTION

Hereinafter, various example embodiments of the disclosure will be described in greater detail with reference to accompanying drawings. However, those of ordinary skill in the art will recognize that various modifications, equivalents, and/or alternatives on the various embodiments described herein can be made without departing from the scope and spirit of the disclosure.

Figure 1:
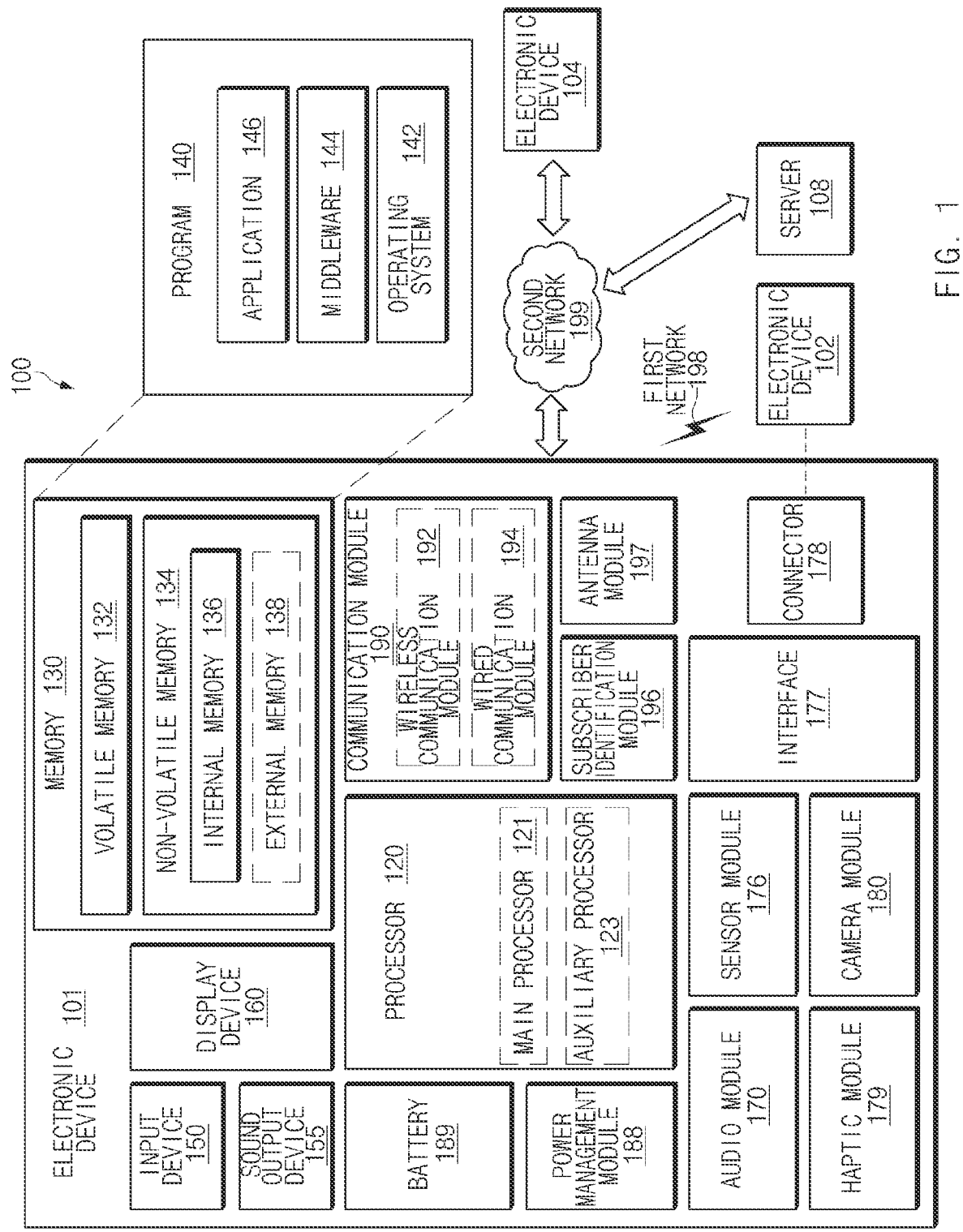
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP))

that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
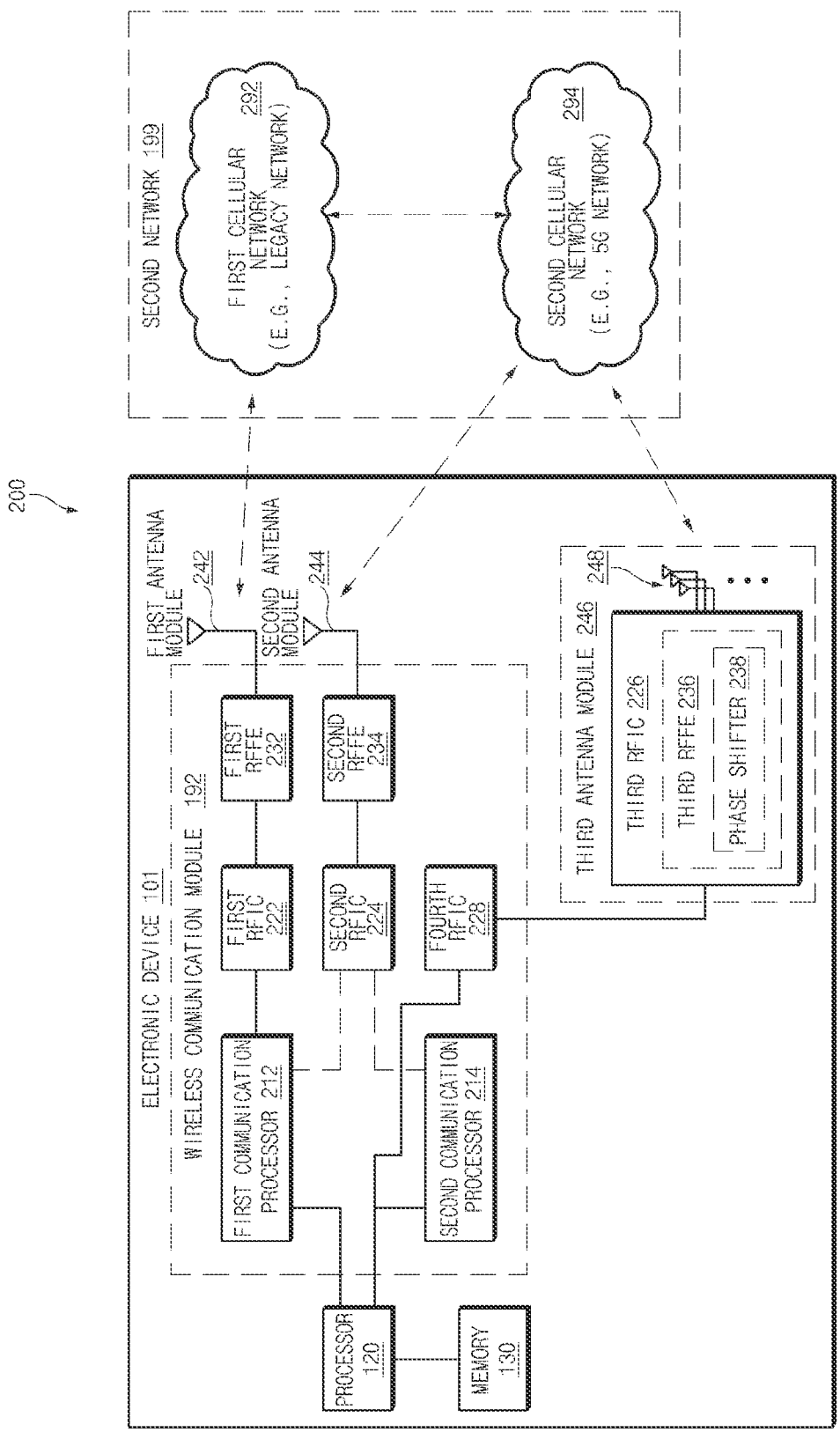
FIG. 2 is a block diagram illustrating an example electronic device for supporting legacy network communication and 5G network communication, according to various embodiments.

FIG. 2 is a block diagram 200 illustrating an example electronic device 101 for supporting legacy network communication and 5G network communication, according to various embodiments. Referring to FIG. 2, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include the processor (e.g., including processing circuitry) 120 and the memory 130. The network 199 may include a first network 292 and a second network 294. According to another embodiment, the electronic device 101 may further include at least one component of the components illustrated in FIG. 1, and the network 199 may further include at least another network. According to an embodiment, the first communication processor 212, the second communication processor 214, the first RFIC 222, the second RFIC 224, the fourth RFIC 228, the first RFFE 232, and the second RFFE 234 may form at least part of the wireless communication module 192. According to another embodiment, the fourth RFIC 228 may be omitted or included as the part of the third RFIC 226.

The first communication processor 212 may include various processing circuitry and establish a communication channel for a band to be used for wireless communication with the first network 292 and may support legacy network communication through the established communication channel. According to various embodiments, the first network may be a legacy network including a 2nd generation (2G), 3G, 4G, or long term evolution (LTE) network. The second communication processor 214 may include various processing circuitry and support the establishment of a communication channel corresponding to a specified band (e.g., about 6 GHz about 60 GHz) among bands to be used for wireless communication with the second network 294 and 5G network communication via the established communication channel. According to various embodiments, the second network 294 may, for example, be a 5G network defined in 3GPP. Additionally, according to an embodiment, the first communication processor 212 or the second communication processor 214 may establish a communication channel corresponding to another specified band (e.g., approximately 6 GHz or lower) of the bands to be used for wireless communication with the second network 294 and may, for example, support 5G network communication through the established communication channel. According to an embodiment, the first communication processor 212 and the second communication processor 214 may be implemented within a single chip or a single package. According to various embodiments, the first communication processor 212 or the second communication processor 214 may be implemented within a single chip or a single package together with the processor 120, the auxiliary processor 123, or the communication module 190. For example, the processor 120 and the first communication processor 212 may be coupled with each other; the processor 120 and the second communication processor 214 may be coupled with each other.

In the case of transmitting a signal, the first RFIC 222 may convert a baseband signal generated by the first communication processor 212 into a radio frequency (RF) signal of about 700 MHz to about 3 GHz that is used in the first network 292. In the case of receiving a signal, an RF signal may be obtained from the first network 292 (e.g., a legacy network) through an antenna (e.g., the first antenna module 242) and may be pre-processed through an RFFE (e.g., the first RFFE 232). The first RFIC 222 may convert the preprocessed RF signal to a baseband signal so as to be processed by the first communication processor 212.

In the case of transmitting a signal, the second RFIC 224 may convert a baseband signal generated by the first communication processor 212 or the second communication processor 214 into an RF signal (hereinafter referred to as a "5G Sub6 RF signal") in a Sub6 band (e.g., about 6 GHz or lower) used in the second network 294 (e.g., a 5G network). In the case of receiving a signal, the 5G Sub6 RF signal may be obtained from the second network 294 (e.g., a 5G network) through an antenna (e.g., the second antenna module 244) and may be pre-processed through an RFFE (e.g., the second RFFE 234). The second RFIC 224 may convert the pre-processed 5G Sub6 RF signal into a baseband signal so as to be processed by a communication processor corresponding to the 5G Sub6 RF signal from among the first communication processor 212 or the second communication processor 214.

The third RFIC 226 may convert a baseband signal generated by the second communication processor 214 into an RF signal (hereinafter referred to as a "5G Above6 RF signal") in a 5G Above6 band (e.g., approximately 6 GHz to approximately 60 GHz) to be used in the second network 294 (e.g., a 5G network). In the case of receiving a signal, the 5G Above6 RF signal may be obtained from the second network 294 (e.g., a 5G network) through an antenna (e.g., the antenna 248), may be pre-processed through a third RFFE 236, and may be converted to an Intermediate Frequency (IF) signal (e.g., about 13 GHz to about 17 GHz). The third RFIC 226 may convert the converted IF signal to a baseband signal to be processed by the second communication processor 214. According to an embodiment, the third RFFE 236 may be formed as the part of the third RFIC 226.

According to an embodiment, the electronic device 101 may further include a fourth RFIC 228. As illustrated in FIG. 2, the fourth RFIC 228 may be formed separately from the third RFIC 226. However, an embodiment of the disclosure is not limited thereto, and the fourth RFIC 228 may be included in the third RFIC 226. The fourth RFIC 228 may be directly connected to the processor 120 through peripheral component interconnect express (PCIe). The fourth RFIC 228 may convert a baseband signal generated by the second communication processor 214 into an RF signal (hereinafter referred to as an "IF signal") in an intermediate frequency band (e.g., ranging from about 9 GHz to about 11 GHz) and may provide the IF signal to the third RFIC 226. The third RFIC 226 may convert the IF signal to the 5G Above6 RF signal. In the case of receiving a signal, the 5G Above6 RF signal may be received from the second network 294 (e.g., a 5G network) through an antenna (e.g., the antenna 248) and may be converted into an IF signal by the third RFIC 226. The fourth RFIC 228 may convert the IF signal into a baseband signal to be processed by the second communication processor 214.

According to an embodiment, the first RFIC 222 and the second RFIC 224 may be implemented with a part of a single chip or a single package. According to an embodiment, the first RFFE 232 and the second RFFE 234 may be implemented as at least part of a single chip or a single package. According to an embodiment, at least one antenna module of the first antenna module 242 or the second antenna module 244 may be omitted or coupled to another antenna module and may process RF signals in a plurality of corresponding bands.

According to an embodiment, the third RFIC 226 and the antenna 248 may be disposed on the same substrate to form the third antenna module 246. For example, the wireless communication module 192 or the processor 120 may be disposed on a first substrate (e.g., a main PCB). In this case, the third RFIC 226 may be disposed in a partial region (e.g., a bottom surface) of a second substrate (e.g., sub PCB) separately of the first substrate; the antenna 248 may be disposed in another partial region (e.g., an upper surface), and thus the third antenna module 246 may be formed. According to an embodiment, for example, the antenna 248 may include an antenna array capable of being used for beamforming. It is possible to reduce the length of the transmission line between the third RFIC 226 and the antenna 248 by positioning the third RFIC 226 and the antenna 248 on the same substrate. The decrease in the transmission line may make it possible to reduce the loss (or attenuation) of a signal in a high-frequency band (e.g., approximately 6 GHz to approximately 60 GHz) used for the 5G network communication due to the transmission line. As such, the electronic device 101 may improve the quality or speed of communication with the second network 294 (e.g., a 5G network).

The second network 294 (e.g., a 5G network) may be used independently of the first network 292 (e.g., a legacy network) (e.g., stand-alone (SA)) or may be used in conjunction with the first network 292 (e.g., non-stand alone (NSA)). For example, only an access network (e.g., a 5G radio access network (RAN) or a next generation RAN (NG RAN)) may be present in the 5G network, and a core network (e.g., a next generation core (NGC)) may be absent from the 5G network. In this case, the electronic device 101 may access the access network of the 5G network and may then access an external network (e.g., Internet) under control of the core network (e.g., an evolved packed core (EPC)) of the legacy network. Protocol information (e.g., LTE protocol information) for communication with the legacy network or protocol information (e.g., New Radio NR protocol information) for communication with the 5G network may be stored in the memory 130 so as to be accessed by another component (e.g., the processor 120, the first communication processor 212, or the second communication processor 214).

FIG. 3A, FIG. 3B, and FIG. 3C are diagrams illustrating an example embodiment of the third antenna module 246 described with reference to FIG. 2. FIG. 3A is a perspective view of the third antenna module 246 when viewed from one side, and FIG. 3B is a perspective view of the third antenna module 246 when viewed from another side. FIG. 3C is a cross-sectional view of the third antenna module 246 taken along a line A-A'.

Referring to FIG. 3A, FIG. 3B, and FIG. 3C, in an embodiment, the third antenna module 246 may include a printed circuit board 310, an antenna array 330, a radio frequency integrated circuit (RFIC) 352, a power management integrated circuit (PMIC) 354, and a module interface. The third antenna module 246 may further include a shielding member 390. In various embodiments, at least one of the above components may be omitted, or at least two of the components may be integrally formed.

The printed circuit board 310 may include a plurality of conductive layers and a plurality of non-conductive layers, and the conductive layers and the non-conductive layers may be alternately stacked. The printed circuit board 310 may provide electrical connection with various electronic components disposed on the printed circuit board 310 or on the outside, using wires and conductive vias formed in the conductive layers.

The antenna array 330 (e.g., 248 of FIG. 2) may include a plurality of antenna elements 332, 334, 336, and 338 disposed to form a directional beam. As illustrated in drawings, the antenna elements may be formed on a first surface of the printed circuit board 310 as illustrated. According to another embodiment, the antenna array 330 may be formed within the printed circuit board 310. According to embodiments, the antenna array 330 may include a plurality of antenna arrays (e.g., a dipole antenna array and/or a patch antenna array), the shapes or kinds of which may be identical or different.

The RFIC 352 (e.g., 226 of FIG. 2) may be disposed on another region (e.g., a second surface facing away from the first surface) of the printed circuit board 310 to be spaced from the antenna array 330. The RFIC 352 may be disposed to be spaced from the antenna element 340 disposed on the second surface of the printed circuit board 310. The RFIC may be configured to process a signal in the selected frequency band, which is transmitted/received through the antenna array 330. According to an embodiment, in the case of transmitting a signal, the RFIC 352 may convert a baseband signal obtained from a communication processor (not illustrated) into an RF signal. In the case of receiving a signal, the RFIC 352 may convert an RF signal received through the antenna array 352 into a baseband signal and may provide the baseband signal to the communication processor.

According to another embodiment, in the case of transmitting a signal, the RFIC 352 may up-convert an IF signal (e.g., approximately 13 GHz to approximately 17 GHz) obtained from an intermediate frequency integrated circuit (IFIC) (e.g., 228 of FIG. 2) into an RF signal. In the case of receiving a signal, the RFIC 352 may down-convert an RF signal obtained through the antenna array 330 into an IF signal and may provide the IF signal to the IFIC.

The PMIC 354 may be disposed on another region (e.g., the second surface) of the printed circuit board 310, which is spaced from the antenna array 330. However, an embodiment of the disclosure is not limited thereto, and the PMIC 354 may be coupled with the RFIC 352. The PMIC may be supplied with a voltage from a main PCB (not illustrated) and may provide a power necessary for various components (e.g., the RFIC 352) on an antenna module.

The shielding member (e.g., shield) 390 may be disposed at a portion (e.g., on the second surface) of the printed circuit board 310 such that at least one of the RFIC 352 or the PMIC 354 is electromagnetically shielded. According to an embodiment, the shielding member 390 may include, for example, and without limitation, a shield can.

Although not illustrated in drawings, in various embodiments, the third antenna module 246 may be electrically connected with another printed circuit board (e.g., a main circuit board) through a module interface. The module interface may include a connection member, for example, and without limitation, a coaxial cable connector, a board to board connector, an interposer, a flexible printed circuit board (FPCB), or the like. The RFIC 352 and/or the PMIC 354 of the antenna module may be electrically connected with the printed circuit board through the connection member.

Figure 4:
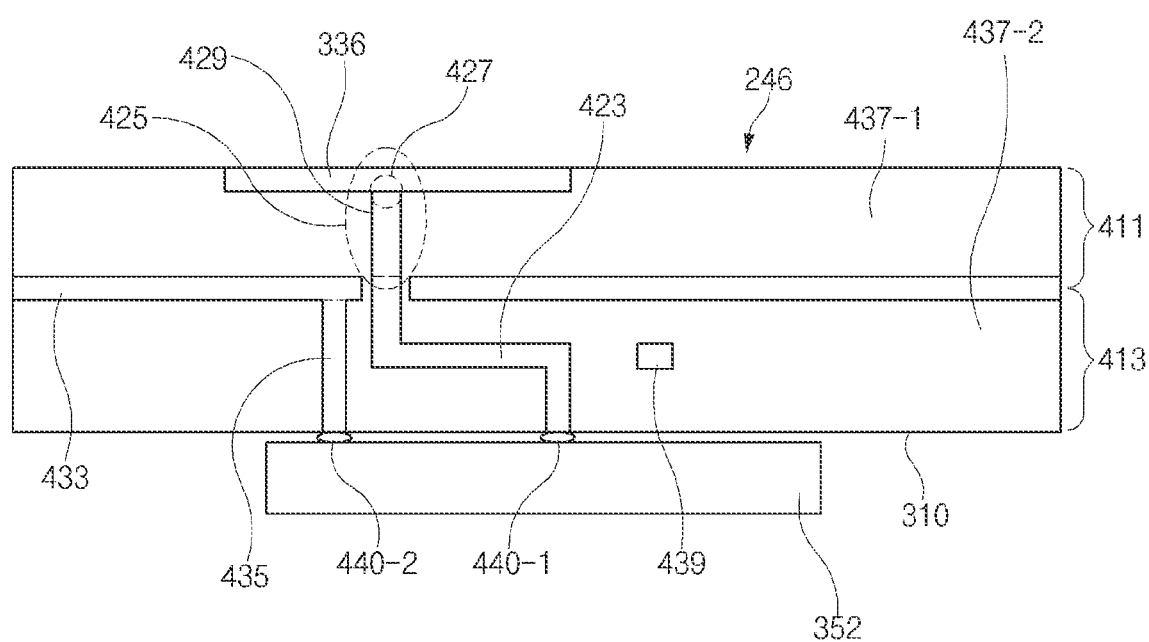
FIG. 4 is a cross-sectional view illustrating an example antenna module taken along a line B-B' of FIG. 3A.

FIG. 4 is a cross-sectional view of the third antenna module 246 taken along a line B-B' of FIG. 3A. In an example embodiment illustrated, a printed circuit board 310 may include an antenna layer 411 and a network layer 413.

The antenna layer 411 may include at least one dielectric layer 437-1, and an antenna element 336 and/or a feed part 425 formed on an outer surface of the dielectric layer 437-1 or therein. The feed part 425 may include a feed point 427 and/or a feed line 429.

The network layer 413 may include at least one dielectric layer 437-2 and at least one ground layer 433, at least one conductive via 435, a transmission line 423, and/or a signal line 439 formed on an outer surface of the dielectric layer 437-2 or therein.

In addition, in the embodiment illustrated, the third RFIC 352 of FIG. 3C may be electrically connected to the network layer 413, for example, through first and second connection parts (e.g., solder bumps) 440-1 and 440-2. In various embodiments, various connection structures (e.g., soldering or a ball grid array (BGA)) may be utilized instead of the solder bumps. The third RFIC 352 may be electrically connected with the antenna element 336 through the first connection part 440-1, the transmission line 423, and the feed part 425. The third RFIC 352 may be electrically connected to the ground layer 433 through the second connection part 440-2 and the conductive via 435. Although not illustrated, the third RFIC 352 may also be electrically connected with the above module interface through a signal line 439.

Figure 5:
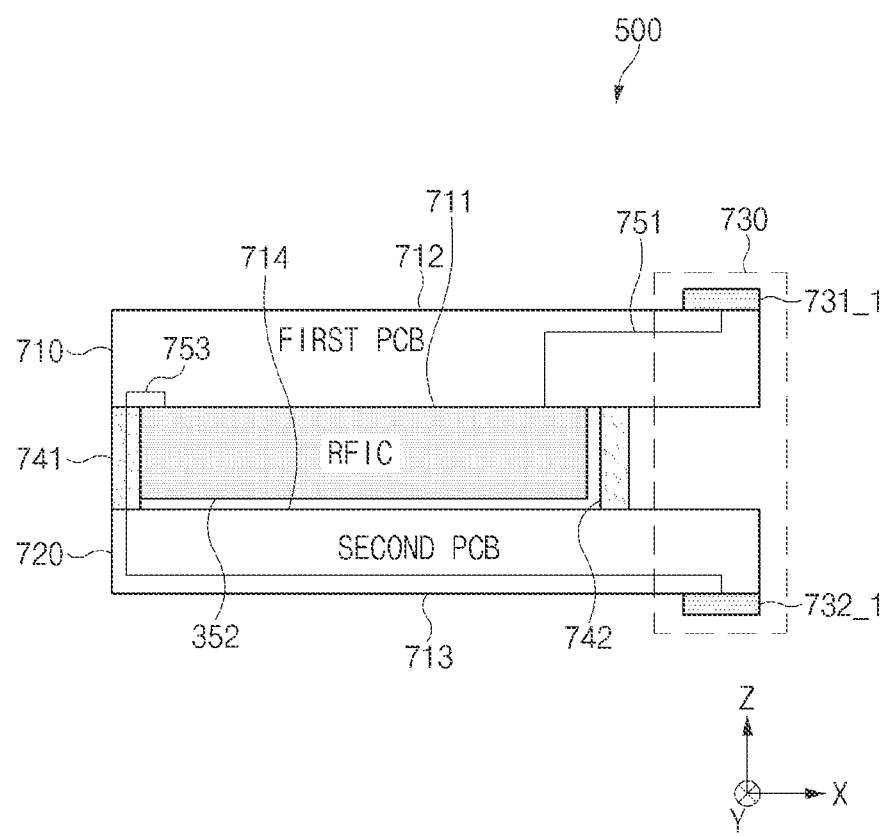
FIG. 5 is a diagram illustrating an example antenna module according to an embodiment.

FIG. 5 is a diagram illustrating an example antenna module 500 according to an embodiment. The antenna module 500 according to an embodiment may include a first PCB 710, a second PCB 720, an RFIC 352, and/or connection members 741 and 742. For example, at least one surface of the antenna module 500 illustrated in FIG. 5 may be a surface on which conductive patterns (e.g., conductive patches) 731_1 and 732_1 are disposed.

In an embodiment, the first PCB 710 may include a first surface 711 and a second surface 712. The first surface 711 may face the first direction. For example, the first direction may be −Z axis direction. The second surface 712 may face the second direction. The second direction may be opposite to the first direction. For example, the second direction may be +Z axis direction.

In an embodiment, the at least one first conductive pattern 731_1 may be disposed on the second surface 712 of the first PCB 710. The at least one first conductive pattern 731_1 may be disposed in a first region 730 of the second surface 712. For example, the at least one first conductive pattern 731_1 may be a conductive patch. However, an embodiment is not limited thereto. The at least one first conductive pattern 731_1 may be a radiator, which transmits and receives signals by forming a beam pattern such as, for example, and without limitation, a patch, a dipole, a slot, or the like.

In an embodiment, the second PCB 720 may include a third surface 713 and a fourth surface 714. The third surface 713 may face the first direction. For example, the second PCB 720 may be disposed in −Z axis direction further than the first PCB 710. The fourth surface 714 may face the second direction. The fourth surface 714 may be spaced from the first surface 711 to face the second direction. For example, the fourth surface 714 may face the +Z-axis direction while being spaced from the first PCB 710 by a specified distance.

In an embodiment, the at least one third conductive pattern 732_1 may be disposed on the third surface 713 of the second PCB 720. The at least one third conductive pattern 732_1 may be disposed in the first region 730 of the third surface 713. For example, the at least one third conductive pattern 732_1 may be a conductive patch. However, an embodiment is not limited thereto. The at least one third conductive pattern 732_1 may be a radiator, which transmits and receives signals by forming a beam pattern such as, for example, and without limitation, a patch, a dipole, a slot, or the like.

In an embodiment, the at least one first conductive pattern 731_1 may be included in a first antenna array. The at least one third conductive pattern 732_1 may be included in a third antenna array. The at least one first conductive pattern 731_1 may have an array structure on the second surface 712 of the first PCB 710 and may be disposed side by side in any direction. For example, the at least one first conductive pattern 731_1 may be disposed side by side in the +Y axis direction to form the first antenna array. The at least one third conductive pattern 732_1 may have an array structure on the third surface 713 of the second PCB 720 and may be disposed side by side in any direction. For example, the at least one third conductive pattern 732_1 may be disposed side by side in the +Y axis direction to form the third antenna array.

In an embodiment, the first antenna array may form a beam pattern in a direction perpendicular to a direction in which the at least one first conductive pattern 731_1 is disposed side by side. The beam pattern may be formed in a direction in which the surface of the at least one first conductive pattern 731_1 faces. For example, the first antenna array may form a beam pattern in +Z axis direction in which the at least one first conductive pattern 731_1 faces. When the at least one first conductive pattern 731_1 is disposed in an array structure, the beam pattern may be formed to have stronger directivity in any direction. Accordingly, when the at least one first conductive pattern 731_1 is disposed in an array structure, the performance of radiating a signal in a specific direction from the at least one first conductive pattern 731_1 may be improved.

In an embodiment, the RFIC 352 may be disposed on the first surface 711. The RFIC 352 may be disposed to be spaced from the second PCB 720.

In an embodiment, the connection members 741 and 742 may include a conductive material and connect the first surface 711 to the fourth surface 714. The connection members 741 and 742 may be interposed between the first PCB 710 and the second PCB 720. For example, the connection members 741 and 742 may be interposer PCBs connecting the first PCB 710 to the second PCB 720.

In an embodiment, the at least one first conductive pattern 731_1 may be connected to the RFIC 352. The at least one first conductive pattern 731_1 may be connected to the RFIC 352 via a first wiring 751. The first wiring 751 may be formed to penetrate the inside of the first PCB 710. The RFIC 352 may feed a signal to be transmitted to the at least one first conductive pattern 731_1 or may receive a signal received from the at least one first conductive pattern 731_1.

In an embodiment, the at least one third conductive pattern 732_1 may be connected to the RFIC 352 via the connection member 741. The at least one third conductive pattern 732_1 may be connected to the RFIC 352 via a third wiring 753. For example, the third wiring 753 may be formed to penetrate the inside of the first PCB 710, the inside of the first connection member 741, and/or the inside of the second PCB 720. The RFIC 352 may feed a signal to be transmitted to the at least one third conductive pattern 732_1 or may receive a signal received from the at least one third conductive pattern 732_1.

In an embodiment, when viewed from above the second surface 712, the at least one first conductive pattern 731_1 and the at least one third conductive pattern 732_1 may be disposed to at least partially overlap with each. The at least one first conductive pattern 731_1 and the at least one third conductive pattern 732_1 may be disposed in the first region 730.

In an embodiment, a space may be formed between the at least one first conductive pattern 731_1 and the at least one third conductive pattern 732_1. The space between the at least one first conductive pattern 731_1 and the at least one third conductive pattern 732_1 may have lower permittivity than the first PCB 710 and/or the second PCB 720. In an embodiment, the space may be filled with a material having a lower permittivity than the first PCB 710 and/or the second PCB 720.

In an embodiment, the at least one first conductive pattern 731_1 and the at least one third conductive pattern 732_1 may form beam patterns in the first direction, the second direction, and/or a direction perpendicular to the first direction and the second direction. When a portion having a low permittivity is formed between the at least one first conductive pattern 731_1 and the at least one third conductive pattern 732_1, the beam patterns formed in the at least one first conductive pattern 731_1 and the at least one third conductive pattern 732_1 may be formed in +Z axis, -Z axis, and/or +X axis direction.

In an embodiment, a conductive pattern may be additionally disposed on at least one surface of the first PCB 710 and/or the second PCB 720. For example, separately from the at least one first conductive pattern 731_1, a conductive pattern may be additionally disposed on the second surface 712 in parallel with the first conductive pattern 731_1.

Figure 6:
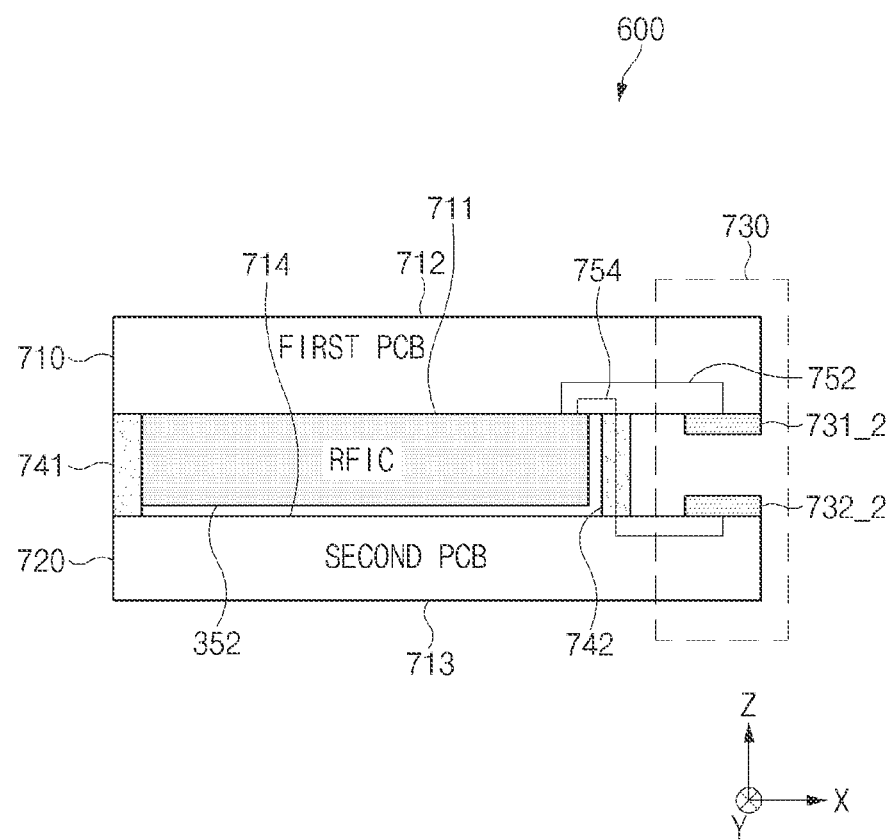
FIG. 6 is a diagram illustrating an example antenna module according to an embodiment.

FIG. 6 is a diagram illustrating an example antenna module 600 according to an embodiment. The antenna module 600 according to an embodiment may include the first PCB 710, the second PCB 720, the RFIC 352, and/or the connection members 741 and 742.

In an embodiment, at least one second conductive pattern 731_2 may be disposed on the first surface 711 of the first PCB 710. The at least one second conductive pattern 731_2 may be disposed in the first region 730 of the first surface 711. For example, the at least one second conductive pattern 731_2 may be a conductive patch. However, an embodiment is not limited thereto. The at least one second conductive pattern 731_2 may be a radiator, which transmits and receives signals by forming a beam pattern such as, for example, and without limitation, a patch, a dipole, a slot, or the like.

In an embodiment, at least one fourth conductive pattern 732_2 may be disposed on the fourth surface 714 of the second PCB 720. The at least one fourth conductive pattern 732_2 may be disposed in the first region 730 of the fourth surface 714. For example, the at least one fourth conductive pattern 732_2 may be a conductive patch. However, an embodiment is not limited thereto. The at least one fourth conductive pattern 732_2 may be a radiator, which transmits and receives signals by forming a beam pattern such as, for example, and without limitation, a patch, a dipole, a slot, or the like.

In an embodiment, the at least one second conductive pattern 731_2 may be included in a second antenna array. The at least one fourth conductive pattern 732_2 may be included in a fourth antenna array. The at least one second conductive pattern 731_2 may have an array structure on the first surface 711 of the first PCB 710 and may be disposed side by side in any direction. For example, the at least one second conductive pattern 731_2 may be disposed side by side in the +Y axis direction to form the second antenna array. The at least one fourth conductive pattern 732_2 may have an array structure on the fourth surface 714 of the second PCB 720 and may be disposed side by side in any direction. For example, the at least one fourth conductive pattern 732_2 may be disposed side by side in the +Y axis direction to form the fourth antenna array.

In an embodiment, the at least one second conductive pattern 731_2 may be connected to the RFIC 352. The at least one second conductive pattern 731_2 may be connected to the RFIC 352 via a second wiring 752. The second wiring 752 may be formed to penetrate the inside of the first PCB 710. The RFIC 352 may feed a signal to be transmitted to the at least one second conductive pattern 731_2 or may receive a signal received from the at least one second conductive pattern 731_2.

In an embodiment, the at least one fourth conductive pattern 732_2 may be connected to the RFIC 352 via the connection member 742. The at least one fourth conductive pattern 732_2 may be connected to the RFIC 352 via a fourth wiring 754. For example, the fourth wiring 754 may be formed to penetrate the inside of the first PCB 710, the inside of the second connection member 742, and/or the inside of the second PCB 720. The RFIC 352 may feed a signal to be transmitted to the at least one fourth conductive pattern 732_2 or may receive a signal received from the at least one fourth conductive pattern 732_2.

In an embodiment, when viewed from above the second surface 712, the at least one second conductive pattern 731_2 and the at least one fourth conductive pattern 732_2 may be disposed to at least partially overlap with each other. The at least one second conductive pattern 731_2 and the at least one fourth conductive pattern 732_2 may be disposed in the first region 730.

In an embodiment, a space may be formed between the at least one second conductive pattern 731_2 and the at least one fourth conductive pattern 732_2. The space between the at least one second conductive pattern 731_2 and the at least one fourth conductive pattern 732_2 may have lower permittivity than the first PCB 710 and/or the second PCB 720. In an embodiment, the space may be filled with a material having a lower permittivity than the first PCB 710 and/or the second PCB 720.

In an embodiment, the at least one second conductive pattern 731_2 and the at least one fourth conductive pattern 732_2 may form beam patterns in the first direction and a direction perpendicular to the second direction. When a portion having a low permittivity is formed between the at least one second conductive pattern 731_2 and the at least one fourth conductive pattern 732_2, the beam pattern formed in the at least one second conductive pattern 731_2 and the at least one fourth conductive pattern 732_2 may be formed in +X axis direction.

Figure 7:
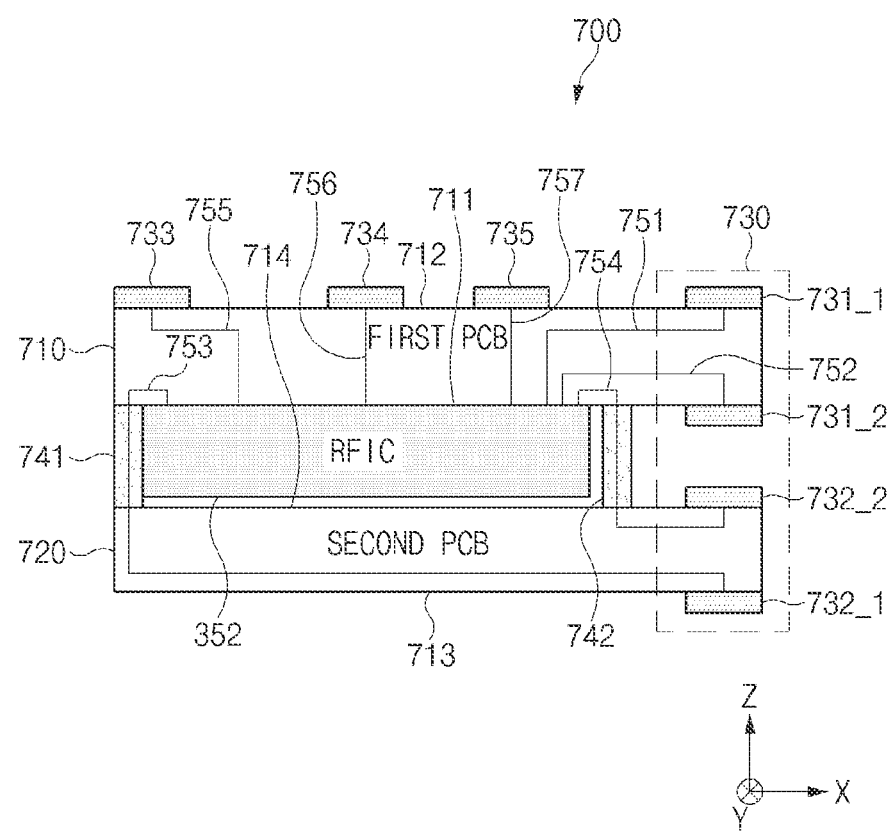
FIG. 7 is a diagram illustrating an example antenna module according to an embodiment.

FIG. 7 is a diagram illustrating an example antenna module 700 according to an embodiment. The antenna module 700 according to an embodiment may include the first PCB 710, the second PCB 720, the RFIC 352, and/or the connection members 741 and 742.

In an embodiment, the first PCB 710 may include the first surface 711 and the second surface 712. The first surface 711 may face the first direction. For example, the first direction may be −Z axis direction. The second surface 712 may face the second direction. The second direction may be opposite to the first direction. For example, the second direction may be +Z axis direction.

In an embodiment, the at least one first conductive pattern 731_1 and the at least one second conductive pattern 731_2 may be disposed on the first surface 711 and/or the second surface 712 of the first PCB 710. The at least one first conductive pattern 731_1 and the at least one second conductive pattern 731_2 may be disposed in at least one of the first region 730 of the first surface 711 and/or the first region 730 of the second surface 712.

In an embodiment, the second PCB 720 may include the third surface 713 and the fourth surface 714. The third surface 713 may face the first direction. For example, the second PCB 720 may be disposed in −Z axis direction further than the first PCB 710. The fourth surface 714 may face the second direction. The fourth surface 714 may be spaced from the first surface 711 to face the second direction. For example, the fourth surface 714 may face the +Z-axis direction while being spaced from the first PCB 710 by a specified distance.

In an embodiment, the at least one third conductive pattern 732_1 and the at least one fourth conductive pattern 732_2 may be disposed on the third surface 713 and/or the fourth surface 714 of the second PCB 720. The at least one third conductive pattern 732_1 and the at least one fourth conductive pattern 732_2 may be disposed in at least one of the first region 730 of the third surface 713 and/or the first region 730 of the fourth surface 714.

In an embodiment, the at least one first conductive pattern 731_1, the at least one second conductive pattern 731_2, the at least one third conductive pattern 732_1, and the at least one fourth conductive pattern 732_2 may have substantially the same shape as one another. The at least one first conductive pattern 731_1, the at least one second conductive pattern 731_2, the at least one third conductive pattern 732_1, and the at least one fourth conductive pattern 732_2 may have substantially the same size as one another.

In an embodiment, the RFIC 352 may be disposed on the first surface 711. The RFIC 352 may be disposed to be spaced from the second PCB 720.

In an embodiment, the connection members 741 and 742 may connect the first surface 711 to the fourth surface 714. The connection members 741 and 742 may be interposed between the first PCB 710 and the second PCB 720. The connection members 741 and 742 may include a conductive material and be interposer PCBs connecting the first PCB 710 to the second PCB 720.

In an embodiment, the at least one first conductive pattern 731_1 and the at least one second conductive pattern 731_2 may be connected to the RFIC 352. The at least one first conductive pattern 731_1 and the at least one second conductive pattern 731_2 may be connected to the RFIC 352 via the first and second wirings 751 and 752. For example, the first and second wirings 751 and 752 may be formed to penetrate the inside of the first PCB 710. The RFIC 352 may feed a signal to be transmitted to the at least one first conductive pattern 731_1 and the at least one second conductive pattern 731_2 or may receive a signal received by the at least one first conductive pattern 731_1 and the at least one second conductive pattern 731_2 from the outside.

In an embodiment, the at least one third conductive pattern 732_1 and the at least one fourth conductive pattern 732_2 may be connected to the RFIC 352 via the connection members 741 and 742. The at least one third conductive pattern 732_1 and the at least one fourth conductive pattern 732_2 may be connected to the RFIC 352 via the third and fourth wirings 753 and 754. For example, the third and fourth wirings 753 and 754 may be formed to penetrate the inside of the first PCB 710, the inside of the connection members 741 and 742, and/or the inside of the second PCB 720. The RFIC 352 may feed a signal to be transmitted to the at least one third conductive pattern 732_1 and the at least one fourth conductive pattern 732_2 or may receive a signal received by the at least one third conductive pattern 732_1 and the at least one fourth conductive pattern 732_2 from the outside.

In an embodiment, when viewed from above the second surface 712, the at least first and second conductive patterns 731_1 and 731_2 and the at least third and fourth patterns 732_1 and 732_2 may at least partially overlap one another. The at least first and second conductive patterns 731_1 and 731_2 and the at least third and fourth conductive patterns 732_1 and 732_2 may be disposed in the first region 730. In an embodiment, the second conductive pattern 731_2 may be disposed on the first surface 711, and the first conductive pattern 731_1 may be disposed on the second surface 712. The third conductive pattern 732_1 may be disposed on the third surface 713, and the fourth conductive pattern 732_2 may be disposed on the fourth surface 714.

In an embodiment, the at least one first conductive pattern 731_1 may be disposed to be adjacent to the second surface 712 or on the second surface 712; the at least one second conductive pattern 731_2 may be disposed to be adjacent to the first surface 711 or on the first surface 711; the at least one third conductive pattern 732_1 may be disposed to be adjacent to the third surface 713 or on the third second surface 713; the at least one fourth conductive pattern 732_2 may be disposed to be adjacent to the fourth surface 714 or on the fourth surface 714. When viewed from the top of the first surface 711, the at least first and second conductive patterns 731_1 and 731_2 and the at least third and fourth conductive patterns 732_1 and 732_2 may at least partially overlap with one another.

In an embodiment, a space may be formed between the at least first and second conductive patterns 731_1 and 731_2 and the at least third and fourth conductive patterns 732_1 and 732_2. The space between the at least first and second conductive patterns 731_1 and 731_2 and the at least third and fourth conductive patterns 732_1 and 732_2 may have lower permittivity than the first PCB 710 and/or the second PCB 720. In an embodiment, the space may be filled with a material having the lower permittivity than the first PCB 710 and/or the second PCB 720.

In an embodiment, the at least first and second conductive patterns 731_1 and 731_2 and the at least third and fourth conductive patterns 732_1 and 732_2 may form a beam pattern in the first direction, the second direction, and/or a direction perpendicular to the first direction and the second direction. A portion having the low permittivity may be formed between the at least first and second conductive patterns 731_1 and 731_2 and the at least third and fourth conductive patterns 732_1 and 732_2, and thus the beam pattern formed by the at least first and second conductive patterns 731_1 and 731_2 and the at least third and fourth conductive patterns 732_1 and 732_2 may be formed in +Z axis, -Z axis, and/or +X axis direction. For example, when the RFIC 352 feeds a signal to the at least one first conductive pattern 731_1 disposed on the second surface 712 and the third conductive pattern 732_1 disposed on the third surface 713, the beam pattern having the directivity in +Z axis and -Z axis directions may be formed. For another example, when the RFIC 352 feeds a signal to the at least one second conductive pattern 731_2 disposed on the first surface 711 and the at least one fourth conductive pattern 732_2 disposed on the fourth surface 714, the beam pattern having the strong directivity in +Y axis and -Y axis directions may be formed.

In an embodiment, the beam patterns effective in 3 directions may be formed using an interposer in the antenna module. For example, a beam pattern may be formed in a direction of the desired surface among the front, rear, and/or side surfaces of the electronic device 101. Accordingly, all three surfaces may be covered using a single antenna module, and thus excellent coverage may be achieved.

In an embodiment, the phase of the first signal fed to the at least one first conductive pattern 731_1 and the at least one second conductive pattern 731_2 may be opposite to the phase of the second signal fed to the at least one third conductive pattern 732_1 and the at least one fourth conductive pattern 732_2. For example, the difference in phase between the first signal fed to the at least one first conductive pattern 731_1 and the at least one second conductive pattern 731_2 and the second signal fed to the at least one third conductive pattern 732_1 and the at least one fourth conductive pattern 732_2 may be 180 degrees. For another example, the current direction of the first signal fed to the at least one first conductive pattern 731_1 and the at least one second conductive pattern 731_2 may be opposite to the current direction of the second signal fed to the at least one third conductive pattern 732_1 and the at least one fourth conductive pattern 732_2.

For example, when the difference in phase between the signal fed to the at least one first conductive pattern 731_1 and the at least one third conductive pattern 731_2 and the signal fed to the at least one third conductive pattern 732_2 is set to 180 degrees, the beam pattern formed by the signal fed to the at least one first conductive pattern 731_1 and the at least one second conductive pattern 731_2 and the beam pattern formed by the signal fed to the at least one third conductive pattern 732_1 and the at least one fourth conductive pattern 732_2 may cause constructive interference with each other. Accordingly, the intensity of the beam pattern may be increased by the at least first and second conductive patterns 731_1 and 731_2 and the at least third and fourth conductive patterns 732_1 and 732_2, thereby improving the communication performance. For another example, in the case of a signal without a phase shift, the at least one first conductive pattern 731_1 and the at least one second conductive pattern 731_2 may form a beam pattern in +Z axis direction, and the at least one third conductive pattern 732_1 and the at least one fourth conductive pattern 732_2 may form a beam pattern in -Z axis direction.

In an embodiment, fifth to seventh conductive patterns 733, 734, and 735 for radiating signals in +Z axis direction may be disposed on the second surface 712 of the first PCB 710. The fifth to seventh conductive patterns 733, 734, and 735 may be connected to the RFIC 352 via fifth to seventh wirings 755, 756, and 757, respectively.

Figure 8A:
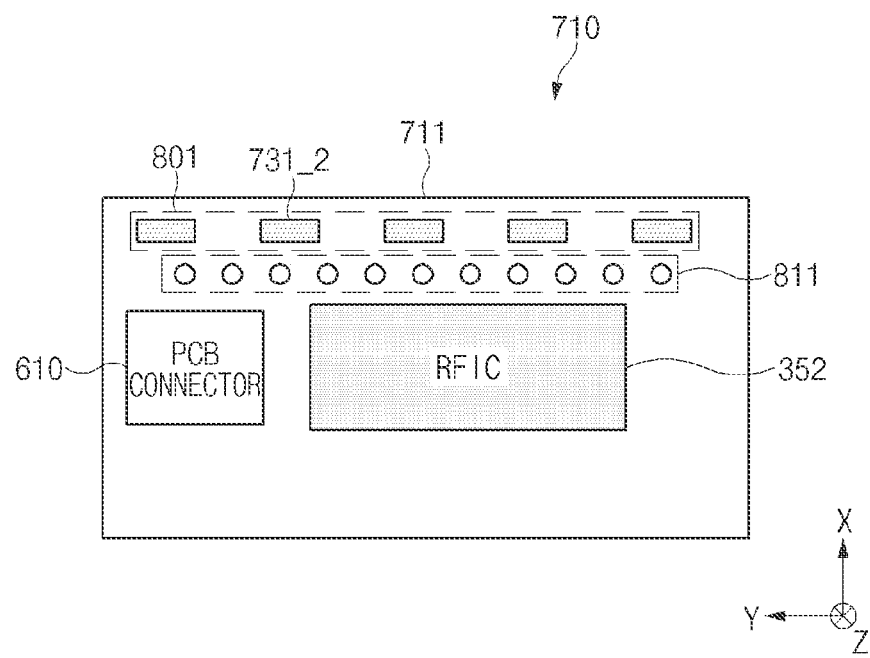
FIG. 8A is a diagram illustrating a first surface of a first PCB according to an embodiment.
Figure 8B:
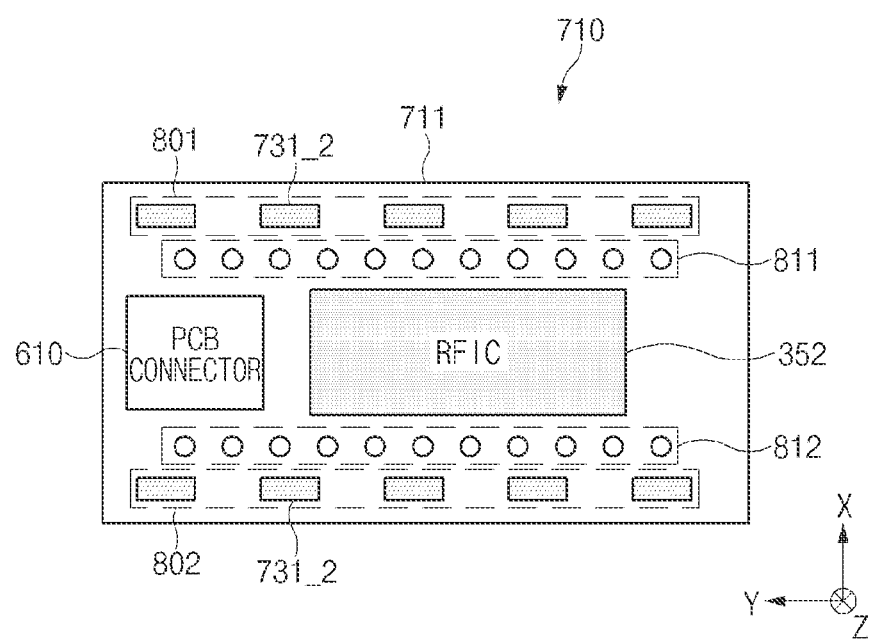
FIG. 8B is a diagram illustrating a first surface of a first PCB according to an embodiment.

FIG. 8A is a diagram illustrating the first surface 711 of the first PCB 710 according to an embodiment. FIG. 8B is a diagram illustrating the first surface 711 of the first PCB 710 according to an embodiment.

In an embodiment, the RFIC 352 may be disposed on at least a partial region of the first surface 711. The RFIC 352 may feed a transmission signal to the at least one second conductive pattern 731_2 or may receive a signal received by the at least one second conductive pattern 731_2.

In an embodiment, at least one antenna array 801 or 802 including the second conductive pattern 731_2 may be formed on the first surface 711 of the first PCB 710. For example, as illustrated in FIG. 8A, the single antenna array 801 may be formed at the edge of a side of the first surface 711. For another example, as illustrated in FIG. 8B, the antenna arrays 801 and 802 may be formed at opposite edges of opposite sides of the first surface 711 to form the two antenna arrays 801 and 802.

In an embodiment, the PCB connector 610 may be disposed not to overlap with the RFIC 352 on the first surface 711. The PCB connector 610 may connect the first PCB 710 to a main PCB (e.g., a main PCB 1150 of FIG. 11). The PCB connector 610 may electrically connect the RFIC 352 to a processor (e.g., the processor 120 of FIG. 1) disposed on the main PCB 1150.

In an embodiment, the at least one second conductive pattern 731_2 may be disposed not to overlap with the RFIC 352 and the PCB connector 610 on the first surface 711. For example, the at least one second conductive pattern 731_2 may be disposed to be adjacent to an edge parallel to Y axis on the first surface 711.

In an embodiment, first connection terminals 811 and 812 may be disposed on the first surface 711. For example, as illustrated in FIG. 8A, the first connection terminal 811 may be formed at one edge of a side on the first surface 711 in X axis direction. For another example, as illustrated in FIG. 8B, the first connection terminals 811 and 812 may be formed at opposite edges of opposite sides on the first surface 711 in X axis direction, respectively. The first connection terminals 811 and 812 may be conductive terminals and/or conductive pads that connect the first PCB 710 to the connection members 741 and 742. For example, the first connection terminals 811 and 812 may be an interposer pin group including metal pads to which the connection members 741 and 742 implemented as interposer PCBs are connected. The first connection terminals 811 and 812 may be connected to the connection members 741 and 742. The connection members 741 and 742 may connect the first connection terminals 811 and 812 to the connection terminals of the second PCB 720 (e.g., second connection terminals 911 and 912 of FIGS. 9A and/or 9B). For example, the connection members 741 and 742 may be formed of via holes. The first connection terminals 811 and 812 may be connected to the second connection terminals 911 and 912 through via holes inside the connection members 741 and 742.

Figure 9A:
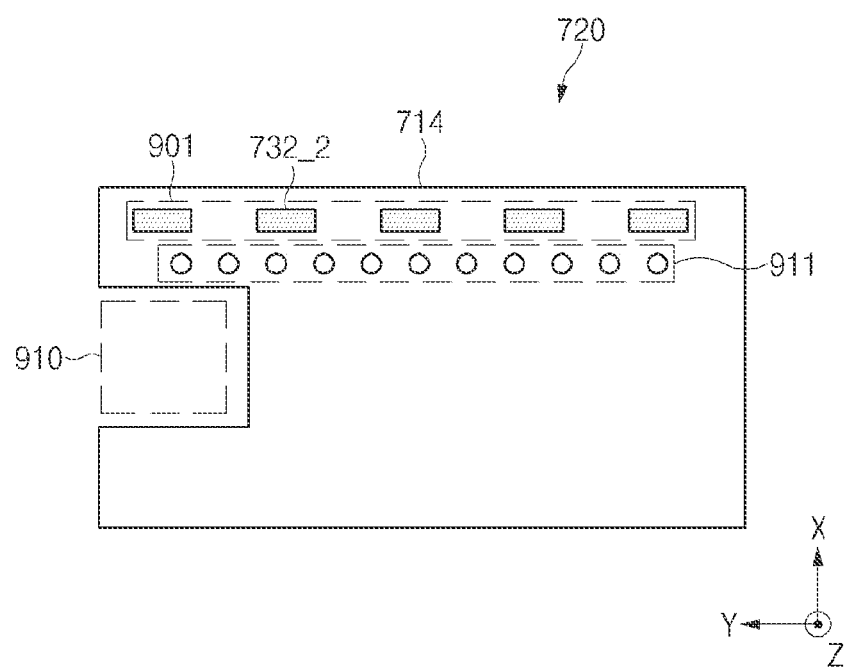
FIG. 9A is a diagram illustrating a fourth surface of a second PCB according to an embodiment.
Figure 9B:
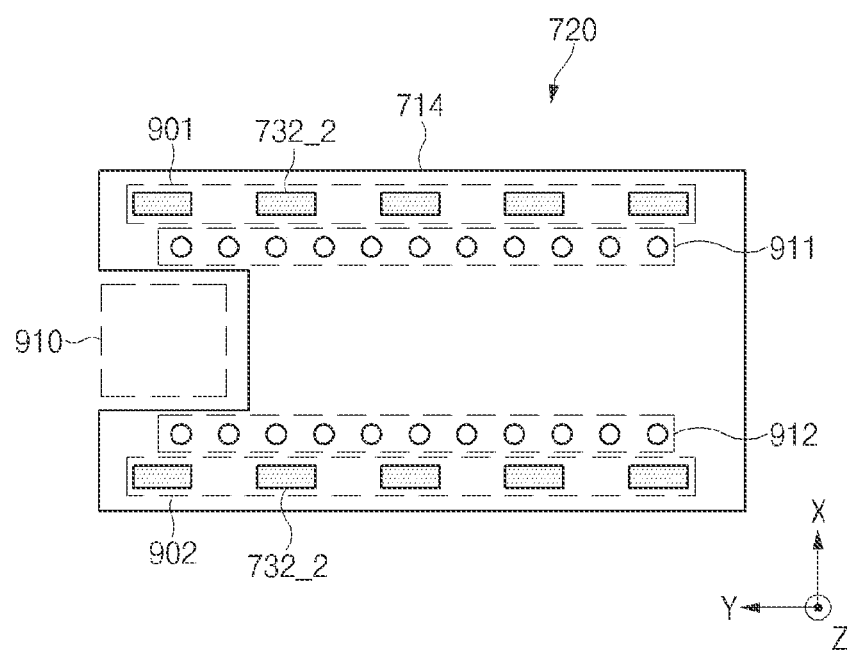
FIG. 9B is a diagram illustrating a fourth surface of a second PCB according to an embodiment.

FIG. 9A is a diagram illustrating the fourth surface 714 of the second PCB 720 according to an embodiment. FIG. 9B is a diagram illustrating the fourth surface 714 of the second PCB 720 according to an embodiment.

In an embodiment, the at least one fourth conductive pattern 732_2 may be disposed on the fourth surface 714. The at least one fourth conductive pattern 732_2 may be disposed to be adjacent to an edge parallel to Y axis on the fourth surface 714.

In an embodiment, at least one antenna array 901 or 902 including the fourth conductive pattern 732_2 may be formed on the fourth surface 714 of the second PCB 720. For example, as shown in FIG. 9A, the single antenna array 901 may be formed at the edge of a side on the fourth surface 714 in Y axis direction. For another example, as illustrated in FIG. 9B, the antenna arrays 901 and 902 may be formed at opposite edges of opposite sides on the fourth surface 714 in Y axis direction to form the two antenna arrays 901 and 902.

In an embodiment, an opening 910 may be formed on the second PCB 720. The opening 910 may be formed to penetrate the second PCB 720 in the first direction. The opening 910 may be formed in a region overlapping with the PCB connector 610 in the first direction on the second PCB 720. A structure in which some regions are removed may be implemented to fasten the PCB connector 610 on the second PCB 720 using the opening 910. When the opening 910 is formed, the PCB connector 610 may be disposed more intentionally. However, an embodiment of the disclosure is not limited thereto, and the PCB connector 610 may be disposed without the opening 910. For example, an additional region for connecting the PCB connector 610 to the main PCB (e.g., the main PCB 1150 of FIG. 11) may be secured. For another example, the PCB connector 610 may be mounted on the second PCB 720.

In an embodiment, second connection terminals 911 and 912 may be disposed on the fourth surface 714. For example, as illustrated in FIG. 9A, the second connection terminal 911 may be formed at one edge of a side on the fourth surface 714. For another example, as illustrated in FIG. 9B, the second connection terminals 911 and 912 may be formed at opposite edges of opposite sides on the fourth surface 714, respectively. The second connection terminals 911 and 912 may be conductive terminals and/or conductive pads that connect the second PCB 720 to the connection members 741 and 742. For example, the second connection terminals 911 and 912 may be an interposer pin group. The second connection terminals 911 and 912 may be formed to face the first connection terminals 811 and 812 in the first direction. The second connection terminals 911 and 912 may be connected to the connection members 741 and 742. For example, the second connection terminals 911 and 912 may be connected to the first connection terminals 811 and 812 through via holes inside the connection members 741 and 742.

Figure 10:
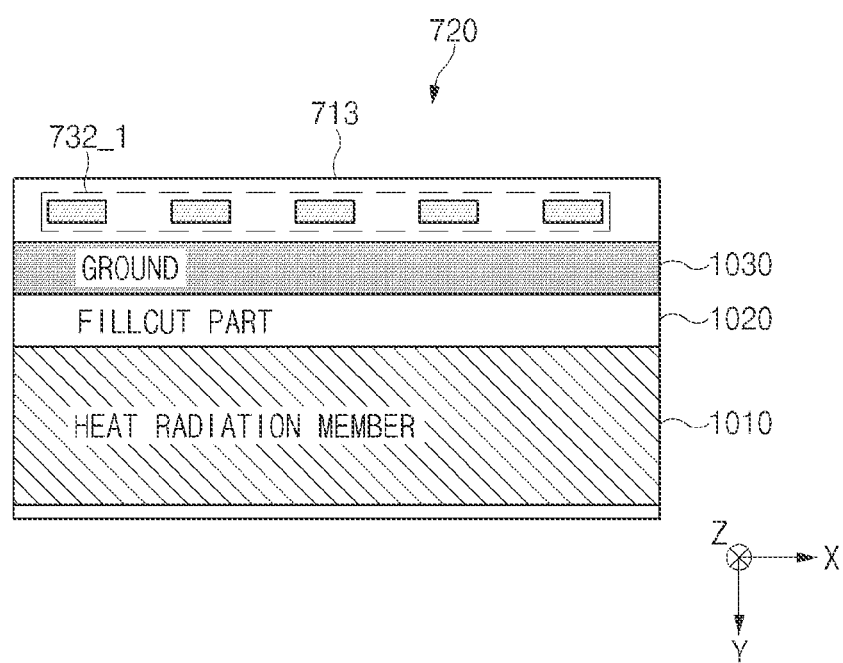
FIG. 10 is a diagram illustrating a third surface of a second PCB according to an embodiment.

FIG. 10 is a diagram illustrating the third surface 713 of the second PCB 720 according to an embodiment.

In an embodiment, a heat radiation member (e.g., a heat radiator or dissipator) 1010 may be disposed in at least a partial region of the third surface 713. The heat radiation member 1010 may be disposed to be spaced from the at least one third conductive pattern 732_1. The heat radiation member 1010 may radiate the heat generated from the second PCB 720. However, an embodiment of the disclosure is not limited thereto, and the heat radiation member 1010 may radiate the heat generated from the first PCB 710 and/or the RFIC 352 to the outside. In an embodiment, the heat radiation member 1010 for heat dissipation of the RFIC 352 may be disposed on the third surface 713 of the second PCB 720 without disposing the at least one third conductive pattern 732_1 in a partial region.

In an embodiment, a ground 1030 may be disposed in at least a partial region of the third surface 713. The ground 1030 may, for example, be a conductive plate or a conductive pattern. The ground 1030 may be disposed to be spaced from the at least one third conductive pattern 732_1.

In an embodiment, a fillcut part 1020 may be disposed in at least a partial region of the third surface 713. The fillcut part 1020 may be interposed between the heat radiation member 1010 and the ground 1030.

In an embodiment, the at least one third conductive pattern 732_1 of the second PCB 720 may form the shape of a horn antenna while being paired with the at least one first conductive pattern 731_1 and the at least one second conductive pattern 731_2.

Figure 11:
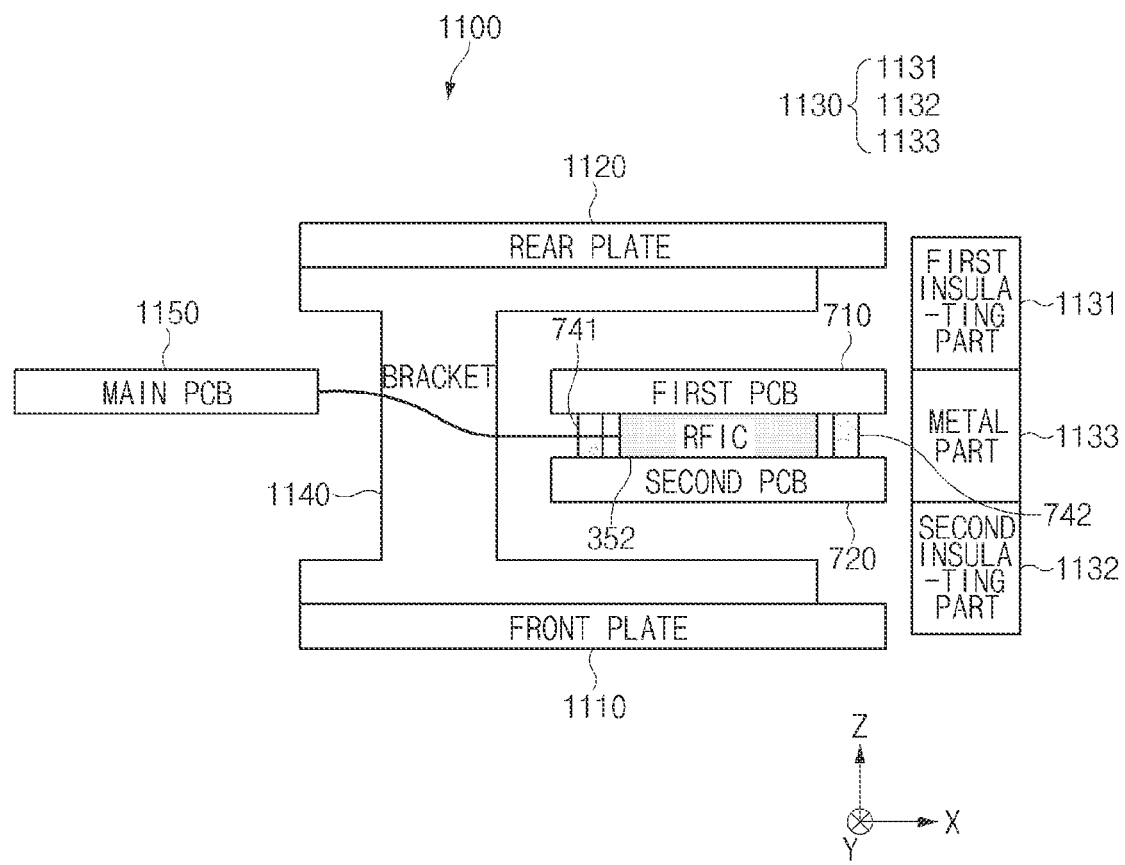
FIG. 11 is a diagram illustrating an electronic device, according to an embodiment.

FIG. 11 is a diagram illustrating an example electronic device 1100 (e.g. the electronic device 101 of FIG. 1) according to an embodiment. The electronic device 1100 may include housings 1110, 1120, and 1130, a bracket 1140, a main PCB 1150, the first PCB 710, the second PCB 720, and/or the connection members 741 and 742.

In an embodiment, the housings 1110, 1120, and 1130 may include a front plate 1110, a rear plate 1120, and/or a side member (e.g., side housing or side surface) 1130. The front plate 1110 may face the first direction. For example, the front plate 1110 may face −Z axis direction. At least part of a display for displaying a screen may be viewable through the front plate 1110. The rear plate 1120 may face the second direction opposite to the first direction. For example, the rear plate 1120 may face +Z axis direction. The rear plate 1120 may be formed of a material capable of absorbing impact from the outside, such as glass and/or reinforced plastic.

In an embodiment, the side member 1130 may enclose a space between the front plate 1110 and the rear plate 1120.

The side member 1130 may connect one side of the front plate 1110 to one side of the rear plate 1120. At least part of the side member 1130 may be a conductive material. For example, the side member 1130 may include a first insulating part 1131 adjacent to the rear plate 1120, a second insulating part 1132 spaced from the first insulating part 1131 and adjacent to the front plate 1110, and a metal part 1133 interposed between the first insulating part 1131 and the second insulating part 1132.

In an embodiment, the bracket 1140 may be disposed in a space formed by the side member 1130. The bracket 1140 may, for example, be formed of metal.

In an embodiment, the main PCB 1150 may be disposed in the space provided by the side member 1130. The main PCB 1150 may include at least one processor (e.g., the processor 120 of FIG. 1). The main PCB 1150 is a term used to indicate that the PCB includes the processor (e.g., including processing circuitry) 120, and is not limited to a major PCB. Accordingly, the main PCB 1150 may be implemented with a general printed circuit board and may be used interchangeably with the term "printed circuit board".

In an embodiment, the first PCB 710 may be disposed in the space formed by the side member 1130. The first PCB 710 may include a first surface (e.g., the first surface 711 in FIG. 7) facing the first direction and a second surface (e.g., the second surface 712 in FIG. 7) facing the second direction. At least one first conductive pattern and/or at least one second conductive pattern (e.g., the at least one first conductive pattern 731_1 and the second conductive pattern 731_2 of FIG. 7) may be disposed on the first surface 711 and/or the second surface 712 of the first PCB 710.

In an embodiment, the second PCB 720 may be disposed in the space formed by the side member 1130. The second PCB 720 may include a third surface (e.g., the third surface 713 in FIG. 7) facing the first direction and a fourth surface (e.g., the fourth surface 714 in FIG. 7) spaced from the first surface 711 and facing the second direction. At least one third conductive pattern and/or at least one fourth conductive pattern may be disposed on the third surface 713 and/or the fourth surface 714 (e.g., the at least one third conductive pattern 732_1 and the at least one fourth conductive pattern 732_2 of FIG. 7) of the second PCB 720.

In an embodiment, the connection members 741 and 742 may connect the first PCB 710 to the second PCB 720. The connection members 741 and 742 may be interposed between the first PCB 710 and the second PCB 720. For example, the connection members 741 and 742 may be interposer PCBs connecting the first surface 711 to the fourth surface 714.

In an embodiment, the RFIC 352 may be mounted on at least one of the main PCB 1150, the first PCB 710, and/or the second PCB 720. For example, as illustrated in FIG. 11, the RFIC 352 may be mounted on one side of the first PCB 710 to be interposed between the first PCB 710 and the second PCB 720; the RFIC 352 and the main PCB 1150 may be electrically connected to each other via at least one wiring. For another example, the RFIC 352 may be mounted on the PCB 1150, and the RFIC 352 and the first PCB 710 may be electrically connected to each other via at least one wiring. For still another example, the RFIC 352 may be mounted on one surface of the second PCB 720.

In an embodiment, the at least one first conductive pattern 731_1 and the at least one second conductive pattern 731_2 may be connected to the RFIC 352. The at least one third conductive pattern 732_1 and the at least one fourth conductive pattern 732_2 may be connected to the RFIC 352 via the connection members 741 and 742. When viewed from above the second surface 712, the at least first and second conductive patterns 731_1 and 731_2 and the at least third and fourth conductive patterns 732_1 and 732_2 may at least partially overlap with one another. For example, the at least one first conductive pattern 731_1 and the at least one second conductive pattern 731_2 may be disposed in the first region 730 of the first surface 711 and the first region 730 of the second surface 712 to overlap with each other in the first direction. The at least one third conductive pattern 732_1 and the at least one fourth conductive pattern 732_2 may be disposed in the first region 730 of the third surface 713 and the first region 730 of the fourth surface 714 to overlap with each other in the first direction.

In an embodiment, the first PCB 710 and the second PCB 720 may be disposed to be adjacent to the metal part 1133. For example, the at least first and second conductive patterns 731_1 and 731_2 and the at least third and fourth conductive patterns 732_1 and 732_2 may be disposed to be adjacent to the metal part 1133 in +X axis direction. A space may be formed between the at least first and second conductive patterns 731_1 and 731_2 and the at least third and fourth conductive patterns 732_1 and 732_2; when view from above the second surface 712, in the case where the at least first and second conductive patterns 731_1 and 731_2 and the at least third and fourth conductive patterns 732_1 and 732_2 at least partially overlap with one another, the beam pattern formed on the first PCB 710 and the second PCB 720 may be formed while bypassing the metal part 1133. Accordingly, the at least first and second conductive patterns 731_1 and 731_2 and the at least third and fourth conductive patterns 732_1 and 732_2 may form a beam pattern facing +X axis direction.

In an embodiment, the bracket 1140 may be disposed to surround the second surface 712 of the first PCB 710 and the third surface 713 of the second PCB 720. The bracket 1140 may be disposed to be spaced from the first PCB 710 and the second PCB 720. The bracket 1140 may be disposed to support the front plate 1110 and the rear plate 1120.

In an embodiment, the antenna module may include the connection members 741 and 742 including interposers. The antenna module may use a configuration in which the first PCB 710 and the second PCB 720 are coupled with each other.

Figure 12:
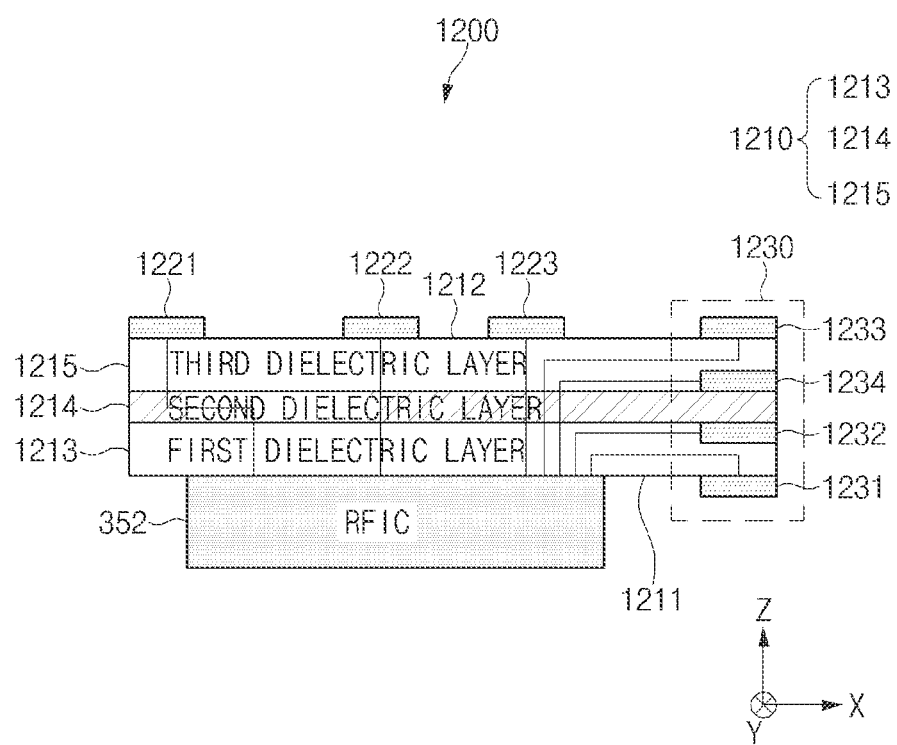
FIG. 12 is a diagram illustrating an example antenna module according to another embodiment.

FIG. 12 is a diagram illustrating an example antenna module 1200 according to another embodiment. An antenna module 1200 according to another embodiment may include a PCB 1210 and/or the RFIC 352.

In an embodiment, the PCB 1210 may include a first surface 1211 and a second surface 1212. The first surface 1211 may face the first direction. For example, the first direction may be −Z axis direction. The second surface 1212 may face the second direction opposite to the first direction. For example, the second direction may be +Z axis direction.

In an embodiment, the PCB 1210 may include a first dielectric layer 1213, a second dielectric layer 1214, and a third dielectric layer 1215. The first dielectric layer 1213 may be disposed to be adjacent to the first surface 1211. The first dielectric layer 1213 may have the first permittivity. The second dielectric layer 1214 may be interposed between the first dielectric layer 1213 and the second surface 1212. For example, the second dielectric layer 1214 may be disposed to be adjacent to a surface facing the second direction of the first dielectric layer 1213. The second dielectric layer 1214 may have the second permittivity different from the first permittivity. For example, the second permittivity may be less than the first permittivity. The third dielectric layer 1215 may be interposed between the second surface 1212 and the second dielectric layer 1214. The third dielectric layer 1215 may have the third permittivity. The third permittivity may be different from the first permittivity and the second permittivity. For example, the third permittivity may be less than the first permittivity and greater than the second permittivity. For another example, the third permittivity may be greater than the first permittivity.

In an embodiment, the PCB 1210 may include at least one first conductive pattern 1231, at least one second conductive pattern 1232, at least one third conductive pattern 1233, and/or at least one fourth conductive pattern 1234. For example, the at least one first conductive pattern 1231, the at least one second conductive pattern 1232, the at least one third conductive pattern 1233, and/or the at least one fourth conductive pattern 1234 may be a patch antenna. The at least one first conductive pattern 1231 and the at least one second conductive pattern and 1232 may be disposed on the first surface 1211 or inside the PCB 1210 to be adjacent to the first surface 1211. For example, the first conductive pattern 1231 may be disposed on the first surface 1211, and the second conductive pattern 1232 may be interposed between the second dielectric layer 1214 and the first dielectric layer 1213. The at least one third conductive pattern 1233 and the at least one fourth conductive pattern and 1234 may be disposed on the second surface 1212 or inside the PCB 1210 to be adjacent to the second surface 1212. For example, the third conductive pattern 1233 may be disposed on the second surface 1212, and the fourth conductive pattern 1234 may be interposed between the second dielectric layer 1214 and the third dielectric layer 1215.

In an embodiment, the RFIC 352 may be disposed on the first surface 1211. The at least first to fourth conductive patterns 1231, 1232, 1233, and 1234 may be connected to the RFIC 352. Each of the at least first to fourth conductive patterns 1231, 1232, 1233, and 1234 and fifth to seventh conductive patterns 1221, 1222, and 1223 may be connected to the RFIC 352 through the wirings disposed inside the PCB 1210.

In an embodiment, when viewed from above the second surface 1212, the at least first to fourth conductive patterns 1231, 1232, 1233, and 1234 may at least partially overlap with one another. Each of the at least first to fourth conductive patterns 1231, 1232, 1233, and 1234 may overlap with one another in the first direction. For example, the at least first to fourth conductive patterns 1231, 1232, 1233, and 1234 may be disposed in the first region 1230 of the PCB 1210. The at least first to fourth conductive patterns 1231, 1232, 1233, and 1234 may overlap with one another in −Z axis direction or +Z axis direction.

In an embodiment, the first dielectric layer 1213 may be interposed between the at least one first conductive pattern 1231 and the at least one second conductive pattern 1232. The third dielectric layer 1215 may be interposed between the at least one third conductive pattern 1233 and the at least one fourth conductive pattern 1234. The second dielectric layer 1214 may be interposed between the at least one second conductive pattern 1232 and the at least one fourth conductive pattern 1234.

In an embodiment, the at least first to fourth conductive patterns 1231, 1232, 1233, and 1234 may form beam patterns in the first direction, the second direction, and/or a direction perpendicular to the first direction and the second direction.

In an embodiment, the difference in phase between the first signal, which is fed to the at least one first conductive pattern 1231 and the at least one second conductive pattern 1232, and the second signal, which is fed to the at least one third conductive pattern 1233 and the at least one fourth conductive pattern 1234, may be 180 degrees. The first signal and the second signal may be substantially the same signal as each other, except the phase difference.

In an embodiment, the PCB 1210 may have a structure in the shape similar to the antenna module using the interposer of FIG. 7, using dielectric layers having different permittivity. In this example, the beam patterns may be formed in various directions by changing the second permittivity of the second dielectric 1214. For another example, in the case where the second dielectric layer 1214 is disposed, because the beam patterns may be formed in various directions even when the strength and/or phase of the signal fed to the at least first to fourth conductive patterns 1231, 1232, 1233, and 1234 is changed, the performance of the antenna module transmitting and receiving signals may be further improved.

Figure 13:
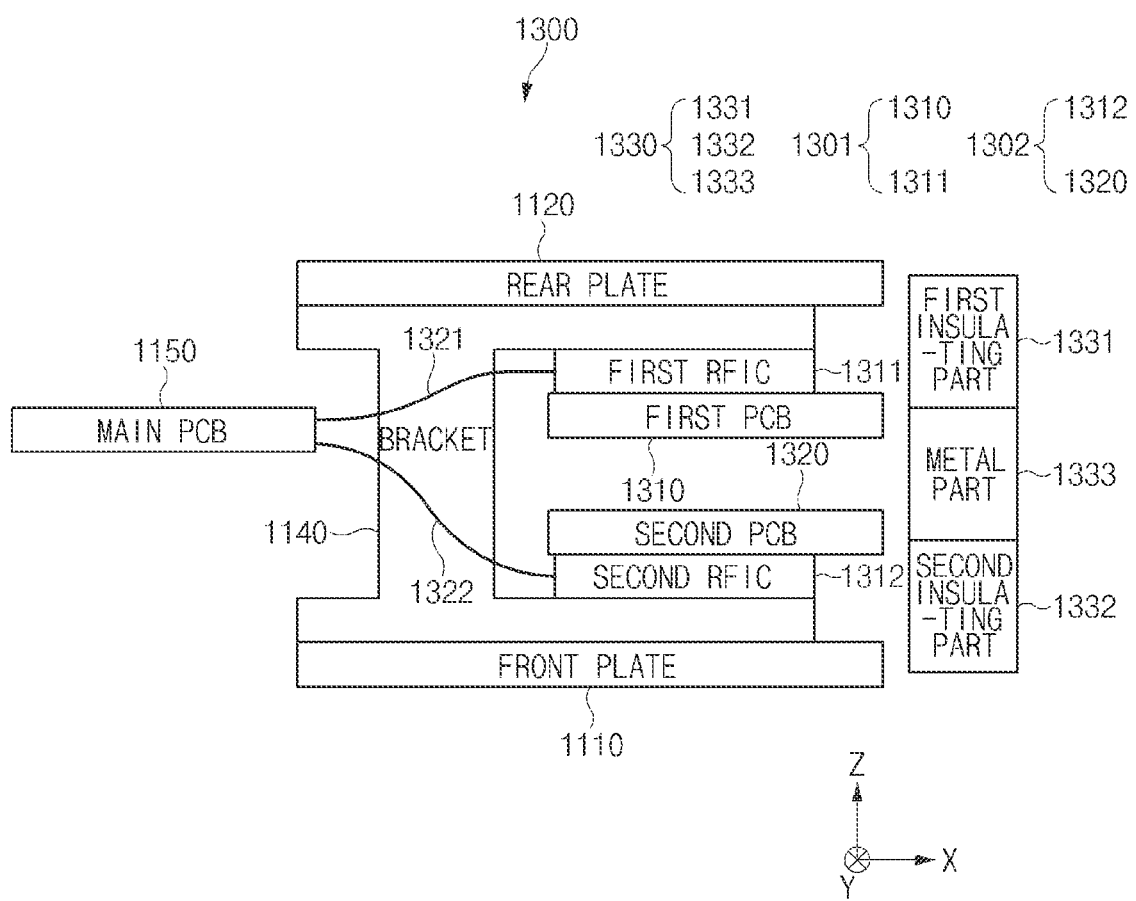
FIG. 13 is a diagram illustrating an example electronic device, according to another embodiment.

FIG. 13 is a diagram illustrating an example electronic device (e.g., the electronic device 101 of FIG. 1) according to another embodiment. The electronic device 101 may include housings 1110, 1120, and 1130, a bracket 1140, a main PCB 1150, a first antenna module 1301, and/or a second antenna module 1302.

According to an embodiment, the first antenna module 1301 may include a first PCB 1310 and/or a first RFIC 1311. The second antenna module 1302 may include a second RFIC 1312 and/or a second PCB 1320. In an embodiment, the first PCB 1310 and/or the second PCB 1320 may be substantially the same as the PCB 1210 of FIG. 12. For another example, the first PCB 1310 and/or the second PCB 1320 may be substantially the same as the first PCB 710 or the second PCB 720 of FIG. 5, 6, or 7.

In an embodiment, the housings 1110, 1120, and 1130 may include a front plate 1110, a rear plate 1120, and/or a side member (e.g., side surface or side housing) 1130. The side member 1130 may form a space between the front plate 1110 and the rear plate 1120. The side member 1130 may connect one side of the front plate 1110 to one side of the rear plate 1120. At least part of the side member 1130 may be a conductive material. For example, the side member 1130 may include a first metal part 1331 adjacent the rear plate 1120, a second metal part 1332 spaced from the first metal part 1331 and adjacent to the front plate 1110, and an insulating part 1333 interposed between the first metal part 1331 and the second metal part 1332.

In an embodiment, the bracket 1140 may be disposed in a space formed by the side member 1330.

In an embodiment, the main PCB 1150 may be disposed in the space formed by the side member 1130. The main PCB 1150 may include at least one processor (e.g., the processor 120 of FIG. 1).

In an embodiment, the first PCB 1310 and/or the second PCB 1320 may be disposed in the space formed by the side member 1130. For example, the second PCB 1320 may be disposed to be adjacent to the front plate 1110, and the first PCB 1310 may be disposed to be adjacent to the rear plate 1120.

In an embodiment, the first and second RFICs 1311 and 1312 may be substantially the same as RFIC (e.g., the RFIC 352 in FIG. 7). A heat radiation part (not illustrated) may be disposed to surround the first and second RFICs 1311 and 1312. The heat radiation part may radiate heat to the outside of the first and second antenna modules 1301 and 1302.

In an embodiment, the bracket 1140 may be disposed to support the rear plate 1120 and front plate 1110. In an embodiment, the first RFIC 1311 may be interposed between the first PCB 1310 and at least part of the bracket 1140. The second RFIC 1312 may be interposed between the second PCB 1320 and at least part of the bracket 1140.

In an embodiment, the main PCB 1150 and the first and second RFICs 1311 and 1312 may be electrically connected to one another. The main PCB 1150 and the first RFIC 1311 may be electrically connected to each other by a first connection member 1321. The main PCB 1150 and the second RFIC 1312 may be electrically connected to each other by a second connection member 1322. For example, the first and second connection members 1321 and 1322 may be implemented with at least one wiring.

In an embodiment, the first PCB 1310 and/or the second PCB 1320 may be disposed in the inner space formed by the bracket 1140. The first PCB 1310 and/or the second PCB 1320 may be disposed to be more adjacent to the metal part 1333 than the first and second RFICs 1311 and 1312. At least one first conductive pattern and/or at least one second conductive pattern (e.g., the at least one first conductive pattern 1231 and the at least one second conductive pattern 1232 of FIG. 12) and/or at least one third conductive pattern and/or at least one fourth conductive pattern (e.g., the at least one third conductive pattern 1233 and the at least one fourth conductive pattern 1234 of FIG. 12) included in the first PCB 1310 and/or second PCB 1320 may form beam patterns in the first direction, the second direction, and/or a direction perpendicular to the first and second directions. When the beam pattern is formed in the direction perpendicular to the first and second direction, the at least one antenna included in the first antenna module 1301 and/or second antenna module 1302 may form a beam pattern in a lateral direction through the insulating parts 1331 and 1332. For example, the first antenna module 1301 and/or the second antenna module 1302 may form a beam pattern that is strongly formed in +X axis direction bypassing the metal part 1333.

Figure 14:
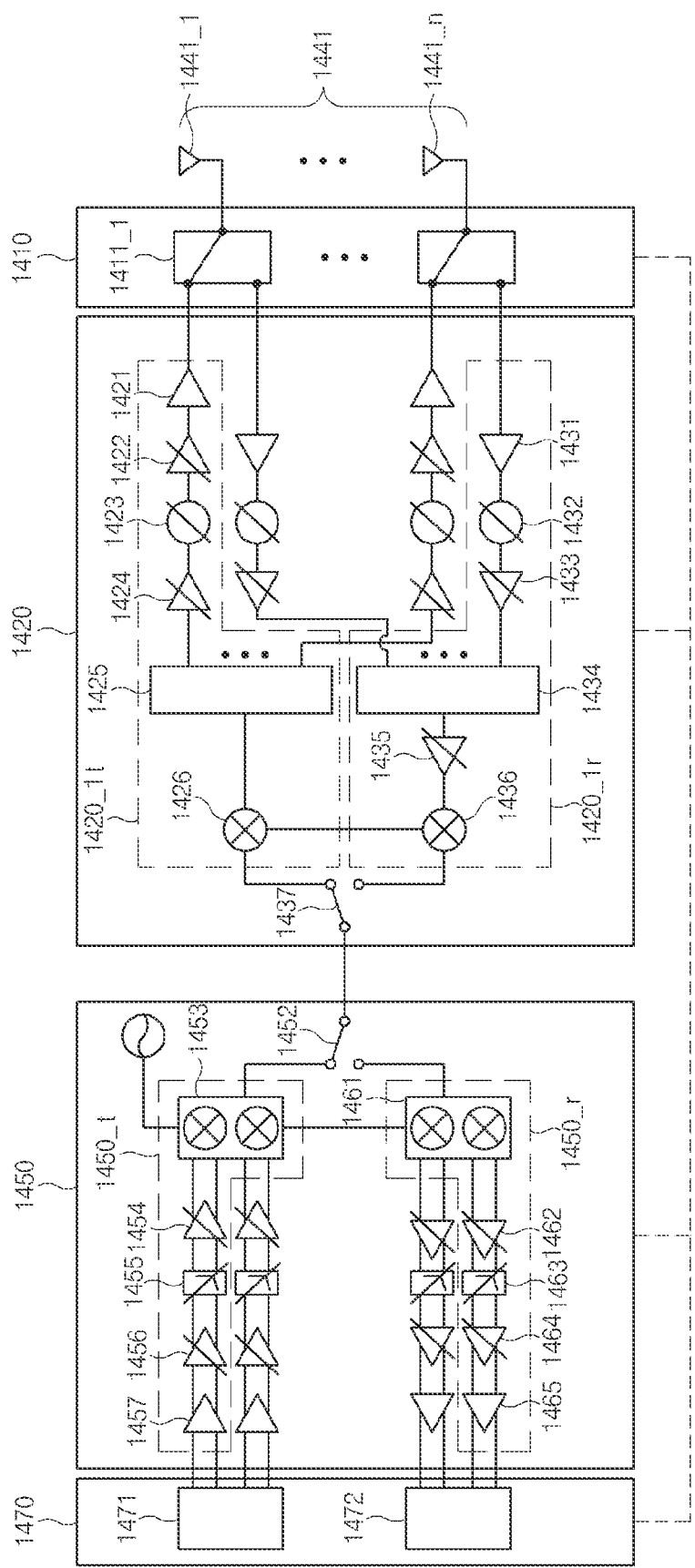
FIG. 14 is a circuit diagram illustrating an example antenna module including a communication circuit according to various embodiments.

FIG. 14 is a circuit diagram illustrating an example antenna module 1442 including a communication circuit 1420 according to various embodiments. The antenna module 1442 may include a switch group 1410, an antenna array 1441 (e.g., the antenna array 330 in FIG. 3), a communication circuit 1420 (e.g., the RFIC 352 in FIG. 3), an IFIC 1450, and/or a communication processor (e.g., including processing circuitry) 1470 (e.g., the processor 120 of FIG. 2, the first communication processor 212, and/or the second communication processor 214). In various embodiments, the antenna module 1442 may further include one or more components or may not include a part of the components.

In an embodiment, the antenna module 1442 may transmit and receive signals using the antenna array 1441. The first antenna element 1441_1 included in the antenna array 1441 may be connected to the communication circuit 1420 through the first switch 1411_1 included in the switch group 1410. When an electronic device (e.g., the electronic device 101 in FIG. 1) transmits an RF signal, the first switch 1411_1 may connect the first antenna element 1441_1 to the power amplifier (PA) 1421 of the communication circuit 1420; when the electronic device 101 receives an RF signal, the first switch 1411_1 may connect the first antenna element 1441_1 to a low noise amplifier (LNA) 1431 of the communication circuit 1420.

In an embodiment, the communication circuit 1420 includes a transmission path 1420_1t of the RF signal used when the electronic device 101 transmits the RF signal and a reception path 1420_1r of the RF signal used when the electronic device 101 receives the RF signal.

In an embodiment, the PA 1421, a first variable gain amplifier (VGA) 1422, a phase shifter (PS) 1423, a second VGA 1424, a divider 1425, and/or a mixer 1426 may be positioned on the transmission path 1420_1t of the RF signal.

In an embodiment, the transmission path 1420_1t of the RF signal may include a plurality of sub transmission circuits. Each sub transmission circuit may include the PA 1421, the first VGA 1422, the PS 1423, and/or the second VGA 1424. The sub transmission circuit may be connected to antenna elements 1411_1 to 1441_n included in the antenna array 1441. For example, the communication circuit 1420 may include a first sub transmission circuit connected to the first antenna element 1411_1. The communication circuit 1420 may include a second sub transmission circuit connected to the second antenna element with have the same structure. In the same manner, the communication circuit 1420 may include an n-th sub-transmission circuit connected to the n-th antenna element 1441_n ('n' is an integer greater than or equal to two).

In an embodiment, the PA 1421 may amplify the power of the RF signal being transmitted. The PA 1421 may be mounted inside or outside the communication circuit 1420. The first VGA 1422 and the second VGA 1424 may perform a transmission auto gain control (AGC) operation under control of the communication processor 1470. The number of VGAs may be two or more or may be less than two. The PS 1423 may change and/or shift a phase of the RF signal based on a beamforming angle under control of the communication processor 1470.

In an embodiment, the divider 1425 and/or the mixer 1426 may be connected to a plurality of sub transmission circuits. The divider 1425 may divide an RF signal from the mixer 1426 into 'n' signals. The number of the divided signals may be the same as the number of antenna elements (e.g., 1441_1 to 1441_n) included in the antenna array 1441. The mixer 1426 may up-convert an IF signal from the IFIC 1450 into an RF signal. The mixer 1426 may receive a signal to be mixed from an internal or external oscillator.

According to an embodiment, an LNA 1431, a PS 1432, a third VGA 1433, a combiner 1434, a fourth VGA 1435, and/or a mixer 1436 may be positioned on the reception path 1420_1r of the RF signal.

In an embodiment, the reception path 420_1r of the RF signal may include a plurality of sub reception circuits. Each sub reception circuit may include the LNA 1431, the PS 1432, and/or the third VGA 1433. Each sub reception circuit may be connected to the antenna array 1441. For example, the communication circuit 1420 may include a first sub reception circuit connected to the first antenna element 1411_1. The communication circuit 1420 may include a second sub reception circuit connected to the second antenna element with the same structure. In the same manner, the communication circuit 1420 may include the n-th sub reception circuit (1431 to 1433) connected to the n-th antenna element 1441_n.

In an embodiment, the LNA 1431 may amplify the RF signal received from the antenna elements 1441_1 to 1441_n. The third VGA 1433 and the fourth VGA 1435 may perform a reception AGC operation under control of the communication processor 1470. The number of VGAs may be two or more or may be less than two. The PS 1432 may change and/or shift a phase of the RF signal based on a beamforming angle under control of the communication processor 1470.

In an embodiment, the combiner 1434 and the mixer 1436 may be connected to a plurality of sub reception circuits. The combiner 1434 may combine RF signals aligned in phase through a phase shift operation. The combined signal may be provided to the mixer 1436 through the fourth VGA 1435. The mixer 1436 may down-convert the received RF signal into an IF signal. In an embodiment, the mixer 1436 may receive a signal to be mixed from an internal or external oscillator.

In an embodiment, the communication circuit 1420 may further include a switch 1437 that electrically connects the mixers 1426 and 1436 to the IFIC 1450. The switch 1437 may selectively connect the transmission path 1420_1t or the reception path 1420_1r of the RF signal with the IFIC 1450.

In an embodiment, the IFIC 450 may include a transmission path 1450_t, a reception path 1450_r, and a switch 1452 selectively connecting to the transmission path 1450_t or the reception path 1450_r.

In an embodiment, a mixer 1453, a fifth VGA 1454, a LPF 1455, a sixth VGA 1456, and/or a buffer 1457 may be positioned on the transmission path 1450_t inside the IFIC 1450. The mixer 1453 may convert a balanced in-phase/quadrature-phase (I/Q) signal of a baseband to an IF signal. The LPF 1455 may function as a channel filter which uses a bandwidth of a baseband signal as a cutoff frequency. The cut-off frequency may be variable. The fifth VGA 1454 and the sixth VGA 1456 may perform a transmission AGC operation under control of the communication processor 1470. The number of VGAs may be two or more or may be less than two. The buffer 1457 may function as buffering upon receiving the Balanced I/Q signal from the communication processor 1470. The IFIC 150 may stably process the Balanced I/Q signal, using the buffer 1457.

According to an embodiment, a mixer 1461, a seventh VGA 1462, an LPF 1463, an eighth VGA 1464, and/or a buffer 1465 may be positioned on the reception path 1450_r inside the IFIC 1450. The functions of the seventh VGA 1462, the LPF 1463, and the eighth VGA 1464 may be the same as or similar to the functions of the fifth VGA 1454, the LPF 1455, and the sixth VGA 1456 positioned on the transmission path 1450_t. The mixer 1461 may convert the IF signal from the communication circuit 1420 into the Balanced I/Q signal in the baseband. The buffer 1465 may function as buffering upon providing the communication processor 1470 with the Balanced I/Q signal in a baseband that passes through the eighth VGA 1464. The IFIC 1450 may stably process the Balanced I/Q signal, using the buffer 1465.

In an embodiment, the communication processor 1470 may include a Tx I/Q digital analog converter (DAC) 1471 and an Rx I/Q analog digital converter (ADC) 1472. The Tx I/Q DAC 1471 may convert the digital signal modulated by a modem (e.g., a modem included in the processor 120 of FIG. 2) into the Balanced I/Q signal and then may transmit the Balanced I/Q signal to the IFIC 1450. The Rx I/Q ADC 1472 may convert the Balanced I/Q signal, which is converted by the IFIC 1450, into a digital signal and may provide the digital signal to the modem. The communication processor 1470 may perform multi input multi output (MIMO). The communication processor 1470 may be implemented with a separate chip or may be implemented in one chip together with any other component (e.g., the IFIC 1450).

Figure 15:
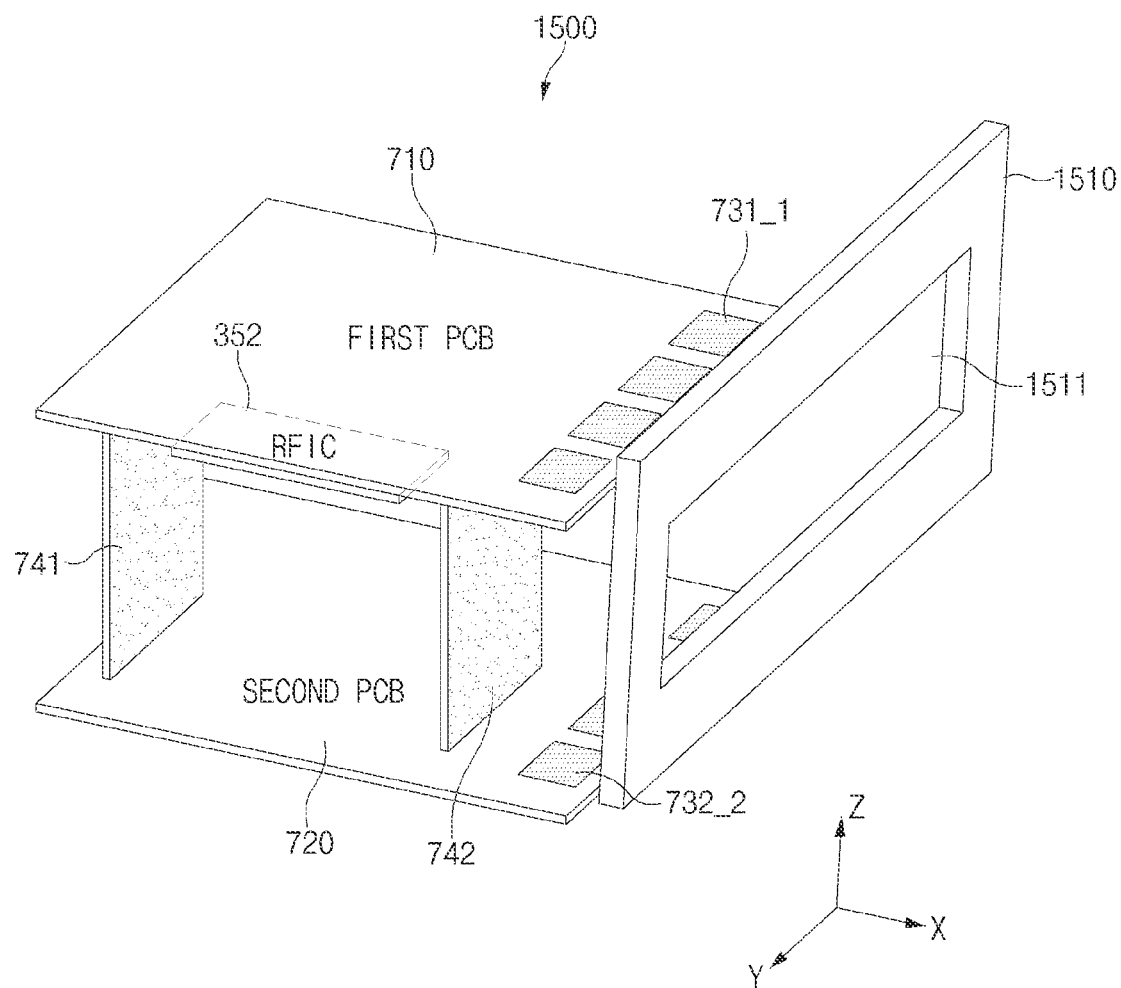
FIG. 15 is a diagram illustrating a first PCB, a second PCB, at least one first conductive pattern, at least one fourth conductive pattern, connection members, a side member, and/or a slit of an electronic device according to an embodiment.

FIG. 15 is a diagram illustrating the first PCB 710, the second PCB 720, the at least one first conductive pattern 731_1, the at least one fourth conductive pattern 732_2, the connection members 741 and 742, a side member (e.g., side housing or side surface) 1510, and/or a slit 1511 of an electronic device 1500 (e.g., the electronic device 101 of FIG. 1) according to an embodiment.

In an embodiment, a slit 1511 may be disposed in at least a partial region of a side member 1510. The slit 1511 may be formed to penetrate the side member 1510 in a direction perpendicular to the first direction and the second direction. For example, the slit 1511 may be formed to penetrate the side member 1510 in +X axis direction.

In an embodiment, the at least first to fourth conductive patterns 731_1, 731_2, 732_1, and 732_2 may be adjacent to the slit 1511. For example, the at least first to fourth conductive patterns 731_1, 731_2, 732_1, and 732_2 may be adjacent to the slit 1511 in +X axis direction.

In an embodiment, when at least part of the side member 1510 of the housing includes a conductive member such as a metal part, excellent coverage may be achieved in the side direction by forming the slit 1511.

Figure 16:
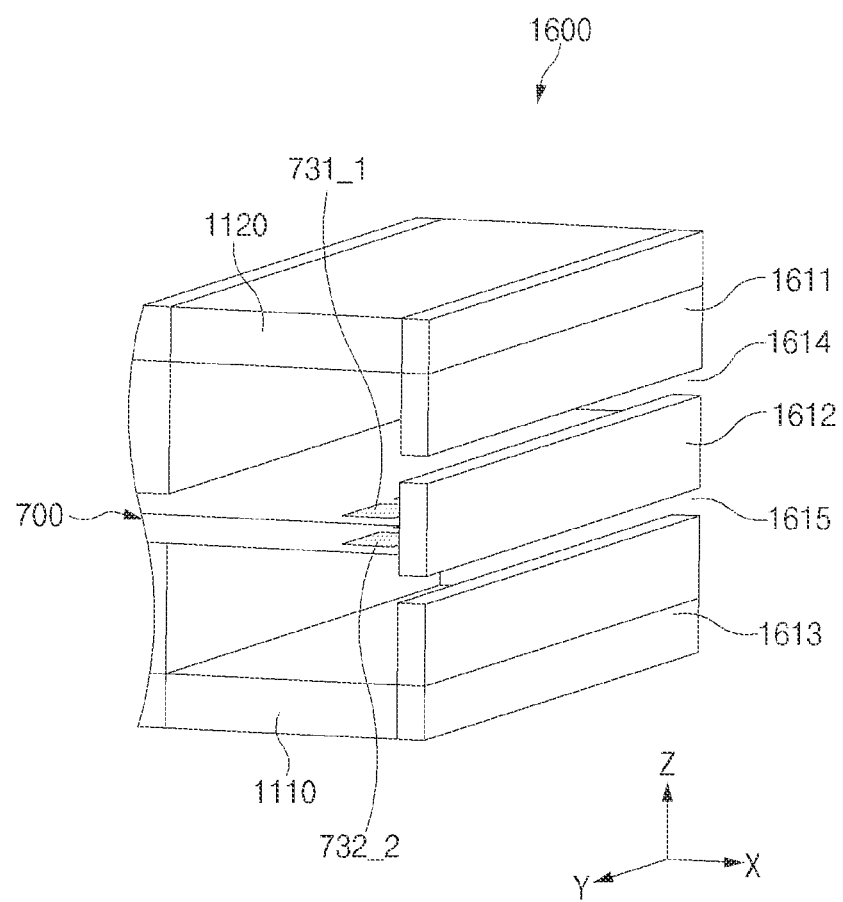
FIG. 16 is a diagram illustrating a front plate, a rear plate, an antenna module, a side member, and slits of an electronic device according to another embodiment.

FIG. 16 is a diagram illustrating a front plate 1110, a rear plate 1120, an antenna module 700, side members 1611, 1612, and 1613, and/or slits 1614 and 1615 of an electronic device (e.g., the electronic device 101 of FIG. 1) according to another embodiment.

In an embodiment, the side members 1611, 1612, and 1613 may have slits 1614 and 1615 in the region adjacent to the antenna module 700. For example, the slits 1614 and 1615 may be formed to penetrate the side members 1611 and 1612 in X axis direction. The one slit 1614 may be formed on the PCB 1210 in +Z axis direction; the other slit 1615 may be formed on the PCB 1210 in −Z axis direction.

In an embodiment, the electronic device may have a structure in which the side members 1611, 1612, and 1613 formed of metal surround the antenna module 700 and the beam pattern formed by the antenna module 700 is radiated by the injection or the partial region such as a space. In this example, a beam pattern may be formed using the patches 731_1 and 732_2 facing each other in the antenna module 700 and the slits 1614 and 1615 included in the side members 1611, 1612, and 1613 including metal, such as the beam pattern of a horn antenna.

Figure 17:
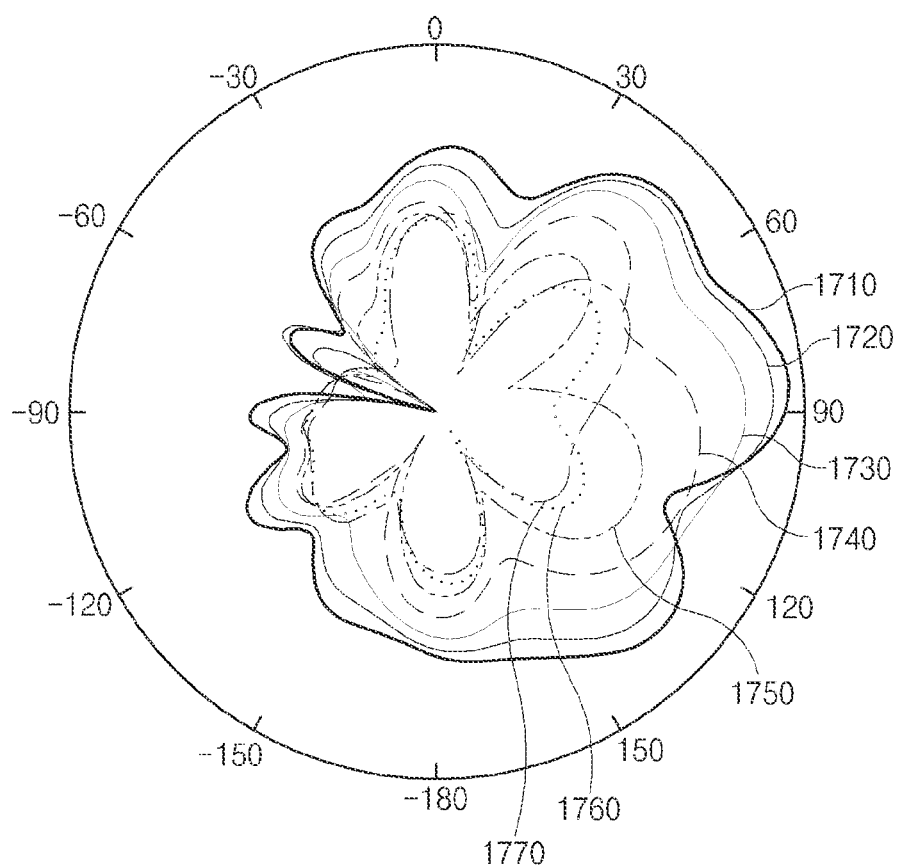
FIG. 17 is a diagram illustrating example beam patterns formed by an antenna module according to an embodiment.

FIG. 17 is a diagram illustrating example beam patterns 1710, 1720, 1730, 1740, 1750, 1760, and 1770 formed by an antenna module according to an embodiment.

In an embodiment, even when having the housing including a side member (e.g., the side member 1130 in FIG. 11) including metal, the antenna module (e.g., the antenna module 700 of FIG. 7) may form beam patterns 1710, 1720, 1730, 1740, 1750, 1760, and 1770 in the desired direction. The beam patterns 1710, 1720, 1730, 1740, 1750, 1760, and 1770 may be variously changed depending on the width of the slit (e.g., the slit 1511 of FIG. 15) formed on the side member (e.g., the side member 1510 of FIG. 15) of the electronic device (e.g., the electronic device 1500 of FIG. 15). For example, the first beam pattern 1710 is a beam pattern in the case where the width of the slit 1511 is the first width; the second beam pattern 1720 is a beam pattern in the case where the width of the slit 1511 is the second width smaller than the first width. In the same manner, the third beam pattern 1730 is a beam pattern in the case where the width of the slit 1511 is the third width smaller than the second width.

In an embodiment, as the width of the slit 1511 increases, the coverage of the beam pattern may increase. Accordingly, the coverage of the first beam pattern 1710 may be greatest. Because the durability may decrease when the width of the slit 1511 increases, the electronic device 101 may control the shapes of the beam pattern 1710, 1720, 1730, 1740, 1750, 1760, and 1770 by adjusting the width of the slit 1511 within the specified range.

According to various example embodiments, an antenna module (e.g., the antenna module 500 of FIG. 5) may include a first PCB (e.g., the first PCB 710 of FIG. 5) including a first surface (e.g., the first surface 711 of FIG. 5) facing a first direction (e.g., −Z direction of FIG. 5) and a second surface (e.g., the second surface 712 of FIG. 5) facing a second direction opposite the first direction, a second PCB (e.g., the second PCB 720 of FIG. 5) including a third surface (e.g., the third surface 713 of FIG. 5) facing the first direction (e.g., −Z axis direction) and spaced from the first PCB 710 and a fourth surface (e.g., the fourth surface 714 of FIG. 5) facing the second direction (e.g., +Z axis direction) and spaced from the first surface 711, an RFIC (e.g., the RFIC 352 of FIG. 5) disposed on the first surface 711, and a connection member comprising a conductive material (e.g., the connection members 741 and 742 of FIG. 5) connecting the first surface 711 to the fourth surface 714. At least one first conductive pattern (e.g., 731_1) may be connected to the RFIC (e.g., 352). At least one third conductive pattern (e.g., 732_1) may be connected to the RFIC (e.g., 352) via the connection member. The at least one first conductive pattern and the at least one third conductive pattern may at least partially overlap with each other, when viewed from above the second surface. At least one first conductive pattern (e.g., the first conductive pattern 731_1 of FIG. 5) is disposed to be adjacent to the first surface and/or the second surface or on the first surface and/or the second surface. At least one third conductive pattern (e.g., the third conductive pattern 732_1 of FIG. 5) is disposed to be adjacent to the third surface and/or the fourth surface or on the third surface and/or the fourth surface.

In an example embodiment, the connection member may be an interposer PCB interposed between the first PCB 710 and the second PCB 720. A first connection terminal (e.g., the first connection terminal 811 of FIG. 8A) connected to the connection member may be disposed on the first surface. A second connection terminal (e.g., the second connection terminal 911 of FIG. 9A) connected to the connection member may be disposed on the fourth surface.

In an example embodiment, the at least one first conductive pattern may be disposed to be adjacent to the first surface or on the first surface. At least one second conductive pattern may be disposed to be adjacent to the second surface or on the second surface. The at least one third conductive pattern may be disposed to be adjacent to the third surface or on the third surface. At least one fourth conductive pattern may be disposed to be adjacent to the fourth surface or on the fourth surface. The at least one first conductive pattern, the at least one second conductive pattern, the at least one third conductive pattern, and the at least one fourth conductive pattern may be at least partially overlap with one another when viewed from above the first surface.

In an example embodiment, a phase of a first signal fed to the at least one first conductive pattern may be opposite to a phase of a second signal fed to the at least one third conductive pattern.

In an example embodiment, the first PCB may further include a PCB connector (e.g., the PCB connector 610 of FIG. 8A) connected to a third PCB (e.g., the main PCB 1150 of FIG. 11) including at least one processor (e.g., the processor 120 of FIG. 1). An opening (e.g., the opening 910 of FIG. 9A) may be formed in a region overlapping with the PCB connector 610 in the first direction (−Z axis direction) on the second PCB 720.

In an example embodiment, a heat radiator (e.g., the heat radiation member 1010 of FIG. 10) configured to radiate heat generated in the second PCB may be disposed in at least a partial region of the third surface of the second PCB. The heat radiator may be spaced from the at least one third conductive pattern.

In an example embodiment, the antenna module may further include a ground (e.g., the ground 1030 of FIG. 10) disposed in the at least a partial region of the third surface of the second PCB spaced from the at least one third conductive pattern and a fillcut part (e.g., the fillcut part 1020 of FIG. 10) interposed between the heat radiation member and the ground.

In an example embodiment, a space may be formed between the at least one first conductive pattern and the at least one third conductive pattern. A beam pattern may be formed based on the space in the first direction (−Z axis direction), the second direction (+Z axis direction), and/or a direction (e.g., +X axis direction of FIG. 5) perpendicular to the first direction and the second direction.

According to various example embodiments, an electronic device (e.g., the electronic device 1100 of FIG. 11) may include a housing including a front plate (e.g., the front plate 1110 of FIG. 11), a rear plate (e.g., the rear plate 1120 of FIG. 11) facing away from the front plate 1110, and a side housing (e.g., the side member 1130 of FIG. 11) surrounding a space between the front plate 1110 and the rear plate 1120 and connecting one side of the front plate 1110 to one side of the rear plate 1120, a printed circuit board (e.g., the main PCB 1150 of FIG. 11) disposed in the space and including at least one processor, a first PCB disposed in the space and including a first surface facing a first direction and a second surface facing a second direction opposite the first direction, a second PCB disposed in the space and including a third surface facing the first direction spaced from the first PCB and a fourth surface facing the second direction, and a connection member comprising a conductive material connecting the first PCB and the second PCB. An RFIC may be mounted on at least one of the printed circuit board or the first PCB. At least one first conductive pattern may be connected to the RFIC. At least one third conductive pattern may be connected to the RFIC via the connection member. At least part of the at least one first conductive pattern and the at least one third conductive pattern may overlap, when viewed from above the second surface. At least part of the side housing may include a conductive material. At least one first conductive pattern may be adjacent to the first surface and/or the second surface or on the first surface and/or the second surface. At least one third conductive pattern may be adjacent to the third surface and/or the fourth surface or on the third surface and/or the fourth surface.

In an example embodiment, the connection member may include an interposer PCB interposed between the first PCB and the second PCB and connecting the first surface and the fourth surface. The side housing may include a first insulating portion (e.g., the first insulating part 1131 of FIG. 11) adjacent to the rear plate, a second insulating portion (e.g., the second insulating part 1132 of FIG. 11) adjacent to the front plate, and a metal portion (e.g., the metal part 1133 of FIG. 11) interposed between the first insulating part and the second insulating part. The first PCB and the second PCB may be disposed to be adjacent to the metal part.

In an example embodiment, the electronic device may further include a bracket (e.g., the bracket 1140 of FIG. 11) disposed to surround the second surface and the third surface. The RFIC may be interposed between the first PCB and the second PCB. The printed circuit board and the RFIC may be electrically connected to each other.

In an example embodiment, the connection member (e.g., the wiring 1321 or 1322 of FIG. 13) may be connected to the printed circuit board and includes at least one wiring electrically connected to the first PCB (e.g., the first PCB 1310 of FIG. 13) and the second PCB (e.g., the second PCB 1320 of FIG. 13). The side housing (e.g., the side member 1330 of FIG. 13) may include a first metal portion (e.g., the first metal part 1331 of FIG. 13) adjacent to the rear plate, a second metal portion (e.g., the second metal part 1332 of FIG. 13) adjacent to the front plate, and an insulating portion (e.g., the insulating part 1333 of FIG. 13) interposed between the first metal portion and the second metal portion. The first PCB and the second PCB may be disposed to be more adjacent to the insulating part than the RFIC (e.g., the first and second RFICs 1311 and 1312 of FIG. 13).

In an example embodiment, the electronic device may further include a bracket (e.g., the bracket 1140 of FIG. 13) contacting the rear plate and the front plate. A first RFIC may be interposed between the first PCB and at least part of the bracket contacting the rear plate. A second RFIC may be interposed between the second PCB and at least part of the bracket contacting the front plate. The printed circuit board and the first RFIC may be electrically connected to each other. The printed circuit board and the second RFIC may be electrically connected to each other.

In an example embodiment, a slit (e.g., the slit 1511 of FIG. 15) may be provided in at least a partial region of the side housing (e.g., the side member 1510 of FIG. 15). The first PCB and the second PCB may be adjacent to the slit.

According to various example embodiments, an antenna module (e.g., the antenna module 1200 of FIG. 12) may include: a PCB (e.g., the PCB 1210 of FIG. 12) including a first surface (e.g., the first surface 1211 of FIG. 12) facing a first direction (e.g., −Z axis direction of FIG. 12) and a second surface (e.g., the second surface 1212 of FIG. 12) facing a second direction (e.g., +Z axis direction of FIG. 12) opposite the first direction and including a first dielectric layer (e.g., the first dielectric layer 1213 of FIG. 12) having a first permittivity interposed between the first surface and the second surface, a second dielectric layer (e.g., the second dielectric layer 1214 of FIG. 12) having a second permittivity different from the first permittivity interposed between the first dielectric layer and the second surface, a third dielectric layer (e.g., the third dielectric layer 1215 of FIG. 12) having a third permittivity different from the first permittivity and the second permittivity interposed between the second dielectric layer and the second surface, at least one first conductive pattern (e.g., the first conductive pattern 1231 of FIG. 12), at least one second conductive pattern (e.g., the second conductive pattern 1232 of FIG. 12), at least one third conductive pattern (e.g., the third conductive pattern 1233 of FIG. 12), and at least one fourth conductive pattern (e.g., the fourth conductive pattern 1234 of FIG. 12), and an RFIC electrically connected to the at least one first conductive pattern, the at least one second conductive pattern, the at least one third conductive pattern, and the at least one fourth conductive pattern and disposed on the first surface. The at least one first conductive pattern may be disposed on the first surface or between the first dielectric layer and the first surface. The at least one second conductive pattern may be interposed between the first dielectric layer and the second dielectric layer. The at least one third conductive pattern may be disposed on the second surface or between the third dielectric layer and the second surface. The at least one fourth conductive pattern may be interposed between the second dielectric layer and the third dielectric layer.

In an example embodiment, the second permittivity is less than the first permittivity and the third permittivity. The at least one first conductive pattern, the at least one second conductive pattern, the at least one third conductive pattern, and the at least one fourth conductive pattern may be configured to form a beam pattern in the first direction, the second, and/or a direction perpendicular to the first direction and the second direction.

In an example embodiment, the antenna module may further include a heat radiator disposed to surround the RFIC and configured to radiate heat to an outside.

In an example embodiment, a phase difference and/or a current direction of a first signal fed to the at least one first conductive pattern and/or the at least one second conductive pattern 1232 may be opposite to a phase difference and/or a current direction of a second signal fed to the at least one third conductive pattern and/or the at least one fourth conductive pattern.

In an example embodiment, each of the at least one first conductive pattern, the at least one second conductive pattern, the at least one third conductive pattern, and the at least one fourth conductive pattern may include a patch antenna, a dipole antenna, or a slot antenna.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various example embodiments disclosed herein, a space is formed between the first patch and the second patch by positioning a connection member between the first PCB where the first patch is positioned and the second PCB where the second patch is positioned. It is possible to allow the permittivity of the dielectric substance positioned between the first patch and the second patch to be different from that of the dielectric substance positioned on the remaining parts in the PCB where the first patch and second patch are positioned. Accordingly, it is possible to form a beam pattern having a wider coverage.

Furthermore, according to various example embodiments disclosed herein, even when a conductive member is included in the housing of the electronic device, the beam pattern may reduce the interference by the conductive member to form a beam pattern with excellent performance.

A variety of effects directly or indirectly understood through the disclosure may be provided.

While the disclosure has been illustrated and described with reference to various example embodiments thereof, it will be understood that the various example embodiments are intended to be illustrative, not limiting. It will also be understood by those skilled in the art that various changes in form and details may be made therein without departing from the true spirit and full scope of the disclosure, including the appended claims and their equivalents.

What is claimed is:

1. An electronic device comprising:
   a first printed circuit board (PCB);
   a second PCB spaced from the first PCB;
   at least one first patch antenna element disposed on a first surface of the first PCB;
   at least one second patch antenna element disposed on at least one surface of the second PCB;
   a radio frequency integrated circuit (RFIC) disposed on a second surface of the first PCB; and
   an interposer disposed between at least the first PCB and the second PCB, and configured to electrically connect the RFIC to the at least one second patch antenna.

2. The electronic device of claim 1,
   wherein a first connection terminal connected to the interposer is disposed on the first PCB, and
   wherein a second connection terminal connected to the interposer PCB is disposed on the second PCB.

3. The electronic device of claim 1, wherein the at least one second patch antenna is configured as an antenna array.

4. The electronic device of claim 1, comprising a housing including a front plate and a rear plate, and wherein:
   the first PCB, the second PCB, and the interposer PCB are disposed in the housing; and
   the RFIC is configured to feed the at least one first patch antenna to radiate a beam through the rear plate.

5. The electronic device of claim 1, comprising a heat radiator configured to radiate heat generated in the second PCB, the heat radiator at least partially disposed in a first partial region of the second PCB.

6. An electronic device, comprising:
   a first printed circuit board (PCB);
   a second PCB spaced from the first PCB;
   at least one radiator disposed on at least one surface of the second PCB;
   a radio frequency integrated circuit (RFIC) disposed on at least one of the first PCB and the second PCB;
   an interposer PCB disposed between at least the first PCB and the second PCB, and configured to electrically connect the RFIC to the at least one radiator;
   a heat radiator configured to radiate heat generated in the second PCB, the heat radiator at least partially disposed in a first partial region of the second PCB;
   a ground at least partially disposed in a second partial region of the second PCB, and spaced from the at least one radiator; and
   a fillcut interposed between at least the heat radiator and the ground.

7. An electronic device comprising:
   a first printed circuit board (PCB);

a second PCB spaced from the first PCB;

a connection member, comprising a connector, connecting the first PCB and the second PCB;

a radio frequency integrated circuit (RFIC) disposed on a first surface of the first PCB;

at least one first patch radiator disposed on a second surface of the first PCB; and at least one second patch radiator disposed on the second PCB and electrically connected to the RFIC via at least the connection member, wherein the RFIC is configured to feed the at least one first and second patch radiators.

8. The electronic device of claim 7, wherein the connection member includes a flexible printed circuit board and/or an interposer PCB.

9. The electronic device of claim 7, wherein the at least one first patch radiator includes a plurality of radiators configured as an antenna array.

10. The electronic device of claim 7, wherein the at least one second patch radiator includes a plurality of radiators configured as an antenna array.

11. The electronic device of claim 7, wherein the RFIC is configured to:

feed the at least one first patch radiator to radiate a beam in a first direction; and feed the at least one second patch radiator to radiate a beam in a second direction different from the first direction.

12. The electronic device of claim 11, wherein the first direction is substantially perpendicular to the second direction.

13. The electronic device of claim 11, wherein the first direction is substantially opposite to the second direction.

14. The electronic device of claim 11, comprising a housing including a front plate, a rear plate, and a side member between at least the front plate and the rear plate, and wherein the RFIC is configured to feed the at least one first patch radiator to radiate a beam in the first direction through the rear plate.

15. The electronic device of claim 14, wherein the RFIC is configured to feed the at least one second patch radiator to radiate a beam in the second direction through the front plate.

16. The electronic device of claim 14, wherein the RFIC is configured to feed the at least one second patch radiator to radiate a beam in the second direction through the side member.

17. The electronic device of claim 1, wherein the RFIC is disposed between the first PCB and the second PCB.

18. The electronic device of claim 7, wherein the RFIC is disposed between the first PCB and the second PCB.

* * * * *